(12) United States Patent
Sakurai

(10) Patent No.: US 6,378,115 B1
(45) Date of Patent: Apr. 23, 2002

(54) LSI MANUFACTURING METHOD AND RECORDING MEDIUM FOR STORING LAYOUT SOFTWARE

(75) Inventor: Atsushi Sakurai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/248,002

(22) Filed: Feb. 10, 1999

(30) Foreign Application Priority Data

Jun. 19, 1998 (JP) .......................................... 10-173547

(51) Int. Cl.⁷ .............................................. G06F 17/50
(52) U.S. Cl. ........................ 716/7; 716/2; 716/5; 716/8; 716/11; 716/13
(58) Field of Search ................................ 716/2, 5, 7, 8, 716/11, 13

(56) References Cited

FOREIGN PATENT DOCUMENTS

| EP | 021 661 | 3/1984 |
| JP | 4-369248 | 12/1992 |
| JP | 5-129436 | 5/1993 |

OTHER PUBLICATIONS

Tsui, R.Y., et al., "A Three–Layer Router for Standard Cell VLSI Circuits"; IEEE Symposium on Circuit and Systems; 1988; pp. 1441–1444.*

* cited by examiner

*Primary Examiner*—Matthew Smith
*Assistant Examiner*—Jibreel Speight
(74) *Attorney, Agent, or Firm*—Staas & Halsey LLP

(57) ABSTRACT

The present invention resolves the problems of conventional top down hierarchical layout design methods by including the following in a top down hierarchical layout design method using soft block, in addition to determining the arrangement of block pin (called "soft pin") in soft block, generating second block pin having the same potential as existing block pin; and moving block pin position to position opposite the block pin to be connected. The layout tool program of the present invention is therefore provided the functions of moving and generating soft pin, whereby the top level signal wiring in the region among the blocks is optimized, delay time is minimized, and the use of wasteful wiring channel is avoided for any combination of blocks.

13 Claims, 23 Drawing Sheets

PRESENT INVENTION

FLOW CHART OF LAYOUT DESIGN

PRESENT INVENTION

LSI MANUFACTURING PROCESS

FLOW CHART OF LAYOUT DESIGN

GUI OF LAYOUT TOOL

MOVE & GENERATE SOFT PIN (1)

MOVE & GENERATE SOFT PIN (2)

MOVE & GENERATE SOFT PIN (3)

SIGNAL WIRING AT TOP LEVEL AND BOTTOM LEVEL

LSI MANUFACTURING METHOD AND RECORDING MEDIUM FOR STORING LAYOUT SOFTWARE

BACKGROUND OF THE INVENTION

1. Field of the Invention

The present invention relates to a method of layout design for LSIs wherein a plurality of blocks is embedded in a chip, and further relates to a LSI (large Scale Integrated Circuit) manufacturing method, whereby top level signal wiring for connecting block pins of blocks can be arranged efficiently in a region among blocks, and a recording medium for storing such a LSI layout program.

2. Description of the Related Art

For ASIC (Application Specific Integrated Circuit) design carried out in a conventional manner, there are two types of layout design methods for circuit elements on a chip and the signal wiring connecting those: flat layout design methods and hierarchical layout design methods.

The flat layout design method is for arranging individual gates at the chip level and creating the wiring among the gates. The design period is tending to become longer for the large scale microchips of recent years and this is a disadvantage for a layout design method. Meanwhile, in hierarchical layout design methods, a chip is divided into a plurality of blocks; blocks which are already designed, or blocks designed and provided by a third party, are used for the blocks. The layout process then mainly involves the arrangement of those blocks and making the wiring among those blocks. Consequently, the design period is shorter than when using flat layout design methods. Also, when design changes become necessary, the layout is changed only for the corresponding block; this can further shorten the design period. Consequently, hierarchical layout design methods are more often used in the design of large scale integrated circuit devices, such as system LSIs.

Such hierarchical layout design methods are divided into bottom up hierarchical layout design methods and top down hierarchical layout design methods. In bottom up hierarchical layout design methods, the blocks are designed first and after the block designs are all completed, floor planning, including the arrangement of the plurality of blocks, is carried out. After which, the top level power main wiring in the region among the blocks, power lead wiring, and signal wiring to connect the block pins of the blocks are designed. As discussed above, the design of each block may be completed in advance in a vendor who designs LSIs, or completed in advance by a third party. Consequently, the positions of the block pins, which are the external terminals of the blocks, are already fixed at the stage where the plurality of blocks is arranged.

FIG. 1 shows problems with bottom up hierarchical layout design methods. Changes cannot be made to the frame (external frame) form, internal wiring layout, and block pin positions in blocks which are already designed. These blocks are called hard blocks. FIG. 1 shows an example wherein hard blocks A and B are adjacent and the block pins 10 and 12 thereof are connected by top level (wiring level between blocks in the region outside the blocks) signal wiring 14, located in the region between the blocks. As this figure clearly shows, the positions of the block pins of each hard block are not optimal and the top level signal wiring 14 for connecting those requires a wasteful wiring channel. Also, the length of the top level signal wiring 14 is not minimized; this leads to signal delays.

Top down hierarchical layout design methods were proposed as methods for correcting the defects of this bottom up hierarchical layout design method. These procedures use soft blocks for which block size, block frame form (aspect ratio), internal wiring, and block pin position are undetermined, and for which net list data, the information on connecting circuit elements, is determined.

Basically, the top down hierarchical layout design method initially determines soft block position, size, frame form, and block pins thereof, along with hard block position and establishes the top level power main wiring, in the region among the blocks. The length of the top level wiring is minimized. The method then arranges top level signal wiring and makes the layout within soft blocks. At the chip layout stage, the use of soft blocks allows for the optimization of soft block size, frame form, and block pins, depending on the combination of hard blocks and soft blocks used.

FIG. 2 shows a sample layout made using a top down hierarchical layout design method. Unlike FIG. 1, the block pins 16 of the soft block A are positioned at a location opposite to the block pins 12 of the hard block B. The length of the top level signal wiring 14 connecting those is therefore minimized and signal delays made small. Moreover, only the use of a vertical signal wiring layer becomes necessary and a wasteful wiring channel is not required.

FIG. 3 shows a problem with the top down hierarchical layout design methods. In the example in FIG. 3, two hard blocks A, C are adjacent to a soft block B. The block pins 16 of the soft block B are located at a position opposite to the block pins 10 of the adjacent hard block A. The top level signal wiring 14, connecting those, is optimized as in FIG. 2. However, the block pins 16 of the soft block B are not located at an optimal position with respect to the block pins 12 of the hard block C. As a result, the length of the top level signal wiring 18, connecting the block pins 16 and 12, is not minimized, signal delays occur, and a wasteful wiring channel becomes necessary.

In this way, conventional top down hierarchical layout design methods using soft blocks result in the heretofore unresolved problems in large scale integrated circuit devices, which use a greater number of blocks.

It is an object of the present invention to provide a layout method, which can optimize top level signal wiring for connections among blocks, and a recording medium for storing such a layout program.

It is another object of the present invention to provide a layout method, which can provide more flexibility in determining the arrangement of block pins of soft blocks and which can allow optimal positioning of block pins, and a recording medium for storing such a layout program.

It is another object of the present invention to provide a LSI manufacturing method, using a layout method with an increased degree of freedom in the number and arrangement of block pins of soft blocks, and a recording medium for storing a layout tool program for executing that layout method.

SUMMARY OF THE INVENTION

In order to achieve the aforementioned objects, the present invention resolves the problems of conventional top down hierarchical layout design methods by including the following in a top down hierarchical layout design method using soft block, in addition to determining the arrangement of block pin (called "soft pin") in soft block: generating second block pin having the same potential as existing block pin; and moving block pin position to position opposite the block pin to be connected. The layout tool program of the present invention is therefore provided the functions of moving and generating soft pin, whereby the top level signal wiring in the region among the blocks is optimized, delay time is minimized, and the use of wasteful wiring channel is avoided for any combination of blocks.

In order to achieve the aforementioned objects, the present invention is a LSI (Large Scale Integrated Circuit) manufacturing method for embedding in a chip a plurality of blocks having prescribed functions and including a plurality of circuit elements and a plurality of block pins connecting externally, wherein the plurality of blocks comprises hard blocks, wherein the block pin in the vicinity of the frame has fixed position at the layout design stage, and soft blocks, wherein the block pin in the vicinity of the frame has variable position at the layout design stage;

the manufacturing method comprising the steps of:

arranging the plurality of blocks on the chip;

moving first block pin in the soft block, to a position in the vicinity of the frame of the soft block, and opposite to first corresponding block pin in a first adjacent block; and forming signal wiring between blocks for connecting the first block pin with the first corresponding block pin opposite thereto in a region between the plurality of blocks.

With the aforementioned invention, the positions of block pin of soft block can be moved to position opposite to the block pin of adjacent block. Also, the signal wiring between blocks, for connecting those block pins, can be made efficiently in the region between blocks.

In order to achieve the aforementioned objects, the present invention is a LSI manufacturing method for embedding in a chip a plurality of blocks having prescribed functions and including a plurality of circuit elements and a plurality of block pins connecting externally, wherein the plurality of blocks comprises hard blocks, wherein the block pin in the vicinity of the frame has fixed position at the layout design stage, and soft blocks, wherein the block pin in the vicinity of the frame has variable position at the layout design stage;

the manufacturing method comprising the steps of:

arranging the plurality of blocks on the chip;

generating second block pin, having the same potential as first block pin in the soft block at a position in the vicinity of the frame of the soft block, and opposite to a second corresponding block pin in a second adjacent block; and forming signal wiring between blocks for connecting the second block pin with the second corresponding block pin opposite thereto in a region between the plurality of blocks.

With the aforementioned invention, the position of block pin of soft block can be moved to position opposite to the block pins of a plurality of adjacent blocks. As a result, the top level signal wiring in the region among blocks can be made efficiently in larger scale integrated circuit devices.

Furthermore, in order to achieve the aforementioned objects, the present invention provides a recording medium for storing the layout tool, whereby the processes of the aforementioned LSI manufacturing method are executed by a computer.

DESCRIPTION OF THE PREFERRED EMBODIMENTS

Below, the preferred embodiments of the present invention are explained with reference to the figures. However, the technical scope of the present invention is not limited to these embodiments.

Figure 1:
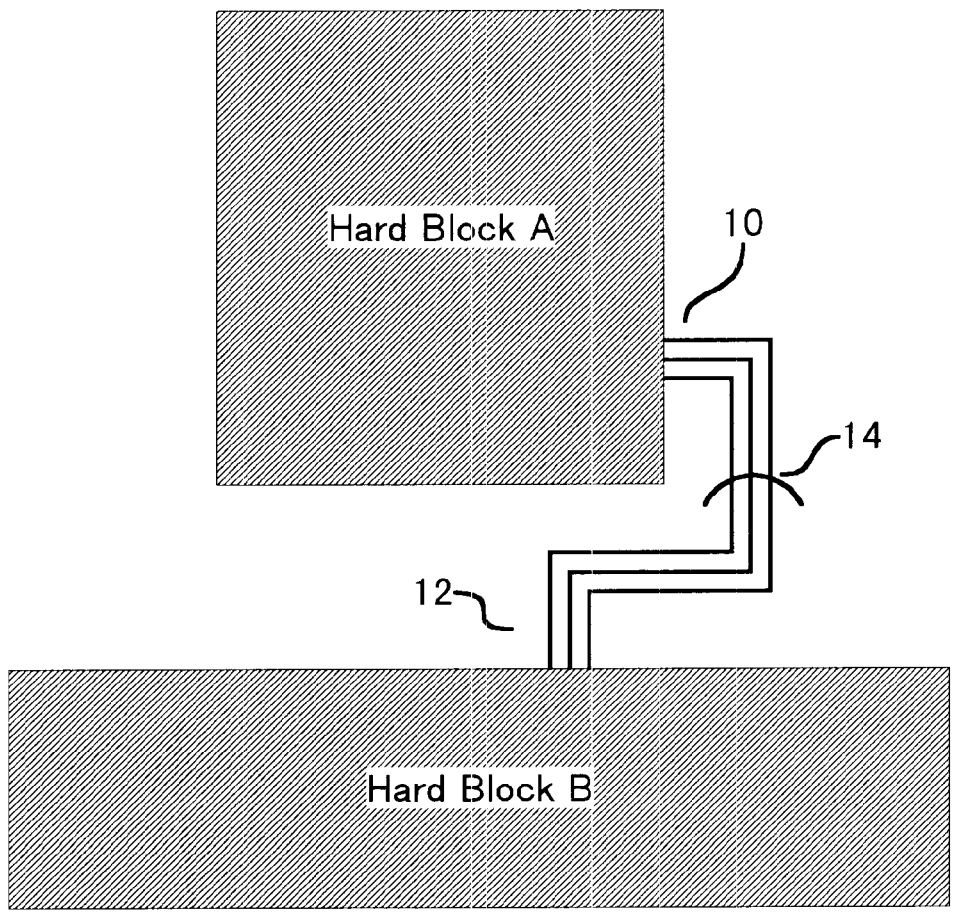
FIG. 1 shows problems with a bottom up hierarchical layout design method.
Figure 2:
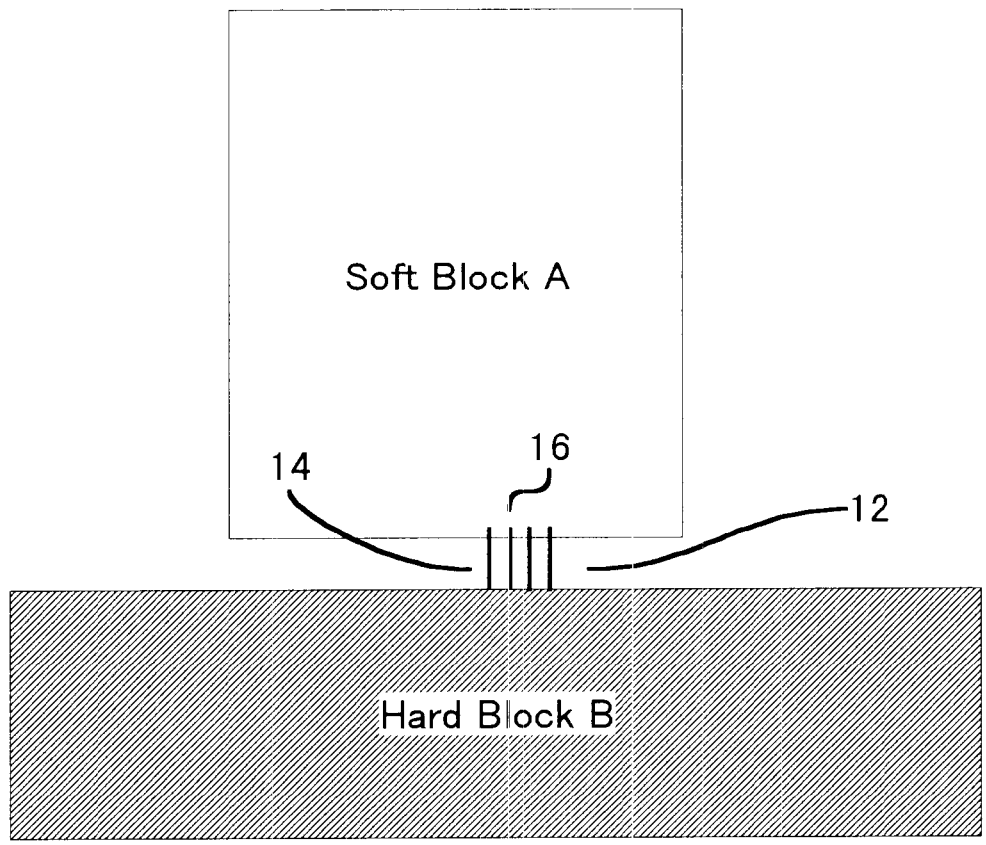
FIG. 2 shows a sample layout using a top down hierarchical layout design method.
Figure 3:
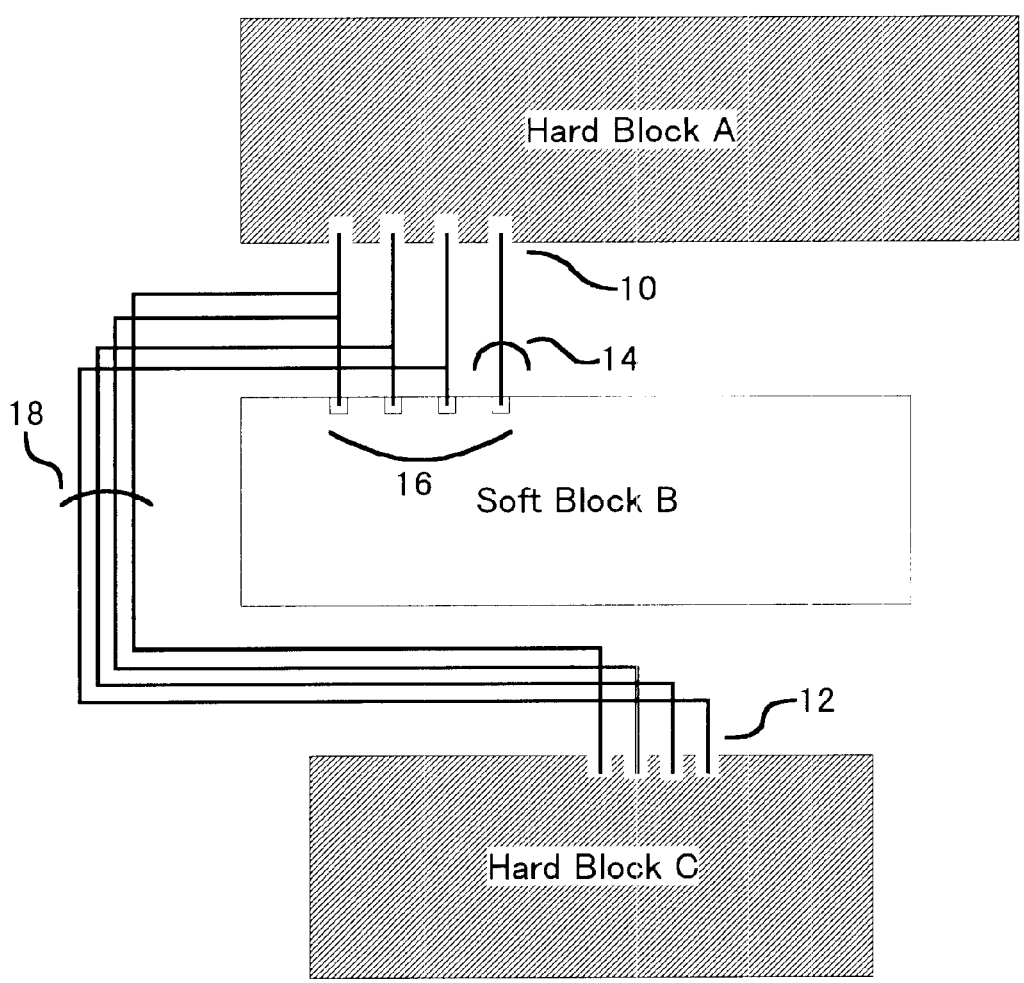
FIG. 3 shows problems with a top down hierarchical layout design method.
Figure 4:
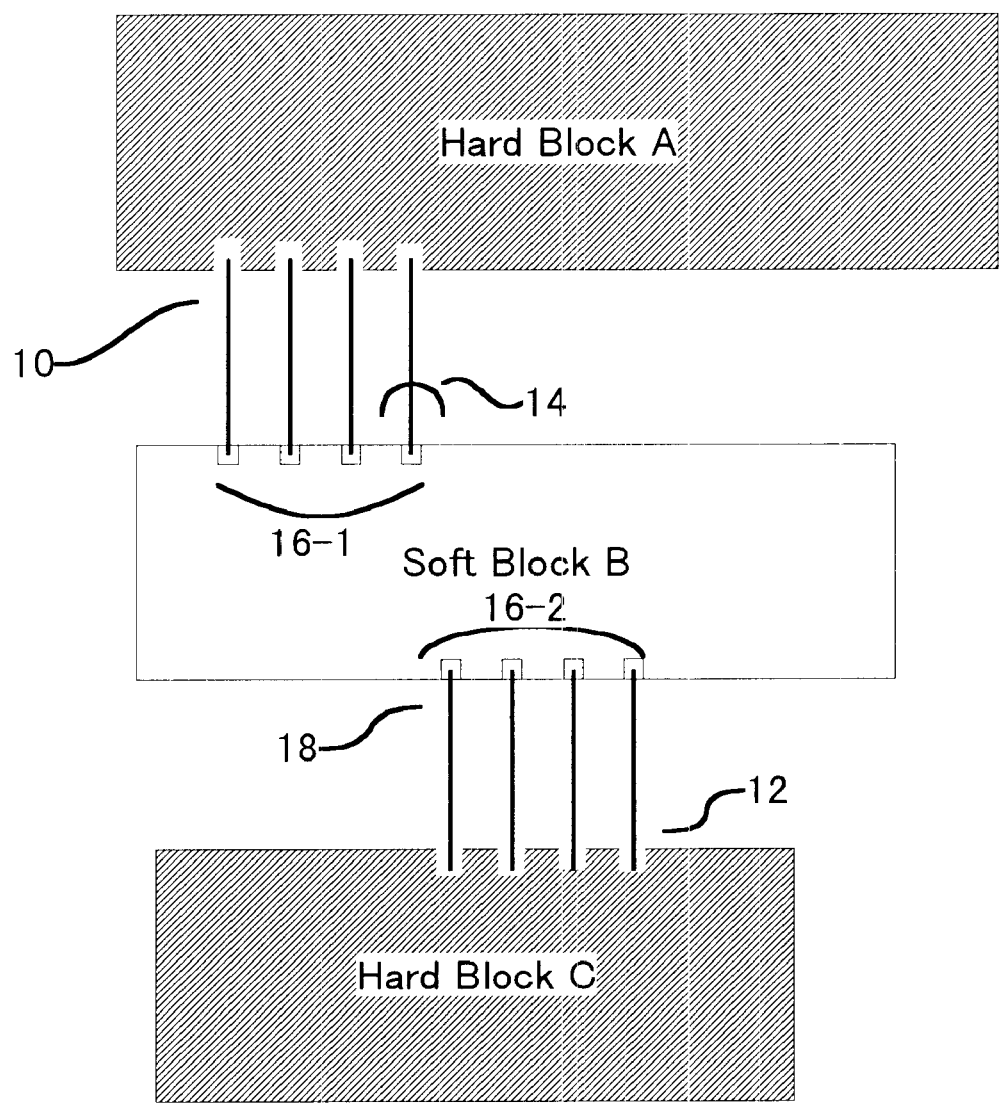
FIG. 4 shows an example of a layout made using the layout tool according to an embodiment of the present invention.

FIG. 4 shows a sample layout in the case of using a layout tool relating to an embodiment of the present invention. Like FIG. 3, the example shows two hard blocks A, C adjacent to a soft block B. Through the use of the layout tool relating to the present embodiment, the block pins 16 of the soft block B comprise first block pins 16-1, located opposite to the block pins 10 of the adjacent hard block A, and second block pins 16-2, located opposite to the block pins 12 of the adjacent hard block C and having the same potential as the first block pins 16-1. In other words, the block pins of the soft block B are generated in duplicate, whereby the block pins 16-1, 16-2 are disposed at a position opposite to the corresponding block pins 10, 12 of the blocks adjacent thereto. The top level signal wiring 14, 18 connecting those can therefore be formed with the minimum length, low signal delay, and in only a single vertical wiring layer; wasted wiring channels are not necessary. These block pins 16-1, 16-2 are located on or in the vicinity of the frame of the soft block B; the block pins 16-1, 16-2 are connected by wiring, not shown, in a region within the soft block B and have the same potential. Consequently, the amount of top level signal wiring in the region between the blocks can be minimized and the layout area of the entire chip can be reduced.

A plurality of circuit elements, such as logical gates and flip-flops, are located within the soft block B. The connective relationship between the block pins and the input and output terminals thereof is provided in the form of net list data. Consequently, once the size and aspect ratio (ratio of vertical to horizontal length), and the number and positions of block pins, of the soft block B are determined, the internal connective wiring is formed according to the net list, designed in advance, by the automatic layout tool (auto place and route, explained below) provided by the layout tool.

Figure 5:
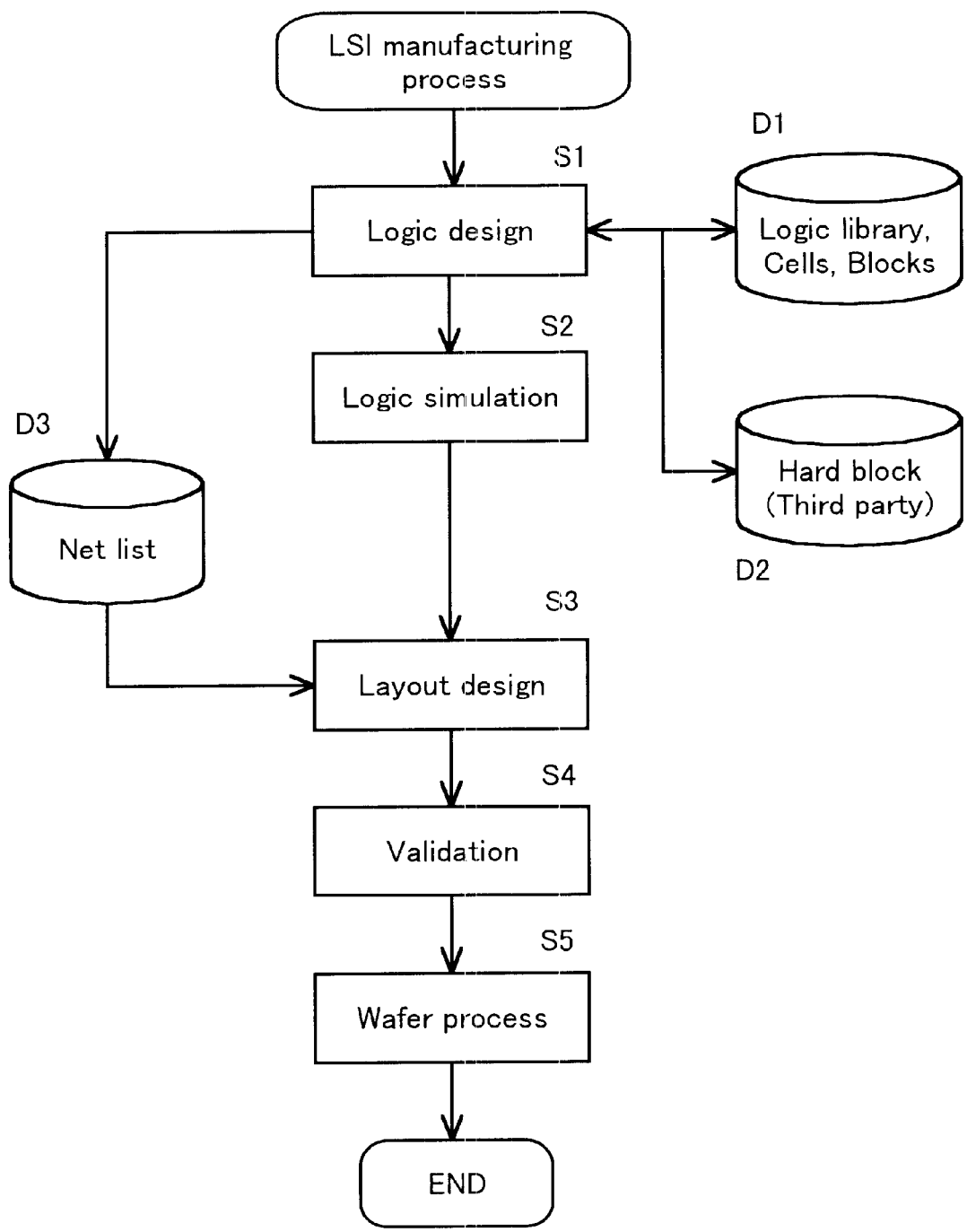
FIG. 5 is a flow chart showing the LSI manufacturing steps.

FIG. 5 is a flow chart showing the LSI manufacturing process. In the logic design process, cells and blocks within a logical library D1 provided in advance, the hard block D2 provided by a third party, and the like are combined and logic circuits within the chip are designed (S1). The cell within the logical library is a logic circuit comprising relatively small scale, general purpose circuit elements, such as AND gates, OR gates, or flip-flops. The block within the logical library is a logic macro, which is greater in scale than cells in memory and ALU, for example; this block comprises hard blocks and soft blocks. The hard block D2 is a logic macro which is on the similar scale, or larger than, the blocks within the logical library D1. Usually, the layout of circuit elements and internal signal wiring of the hard block are fixed and the block pins are fixed as well.

In the logic design process, a plurality of blocks are embedded and a plurality of cells are positioned within the chip. A net list D3 for logic circuits in the chip is generated according to the logic design process.

Logic simulation is performed for this net list (S2). In the logic simulation process, the delay time for a hypothetical layout is calculated. On the basis of that delay time, a test is performed to check whether the expected output data pattern is attained for a given input data pattern. When the designed logic circuit passes this logic simulation, the process advances to the next layout design process.

In a layout design process (S3), a plurality of blocks and cells are laid out on the chip, then top level signal wiring connecting the blocks and cells and top level power wiring for supplying power thereto are generated on the basis of the net list D3 generated in logic design (S3). At this stage, a detailed pattern layout is made for the chip and the LSI generated in layout design is subject to validation (S4). If it passes, an actual microchip is formed in wafer fabrication processing (S5).

The layout tool in the present embodiment is used in the aforementioned layout design process S3.

Figure 6:
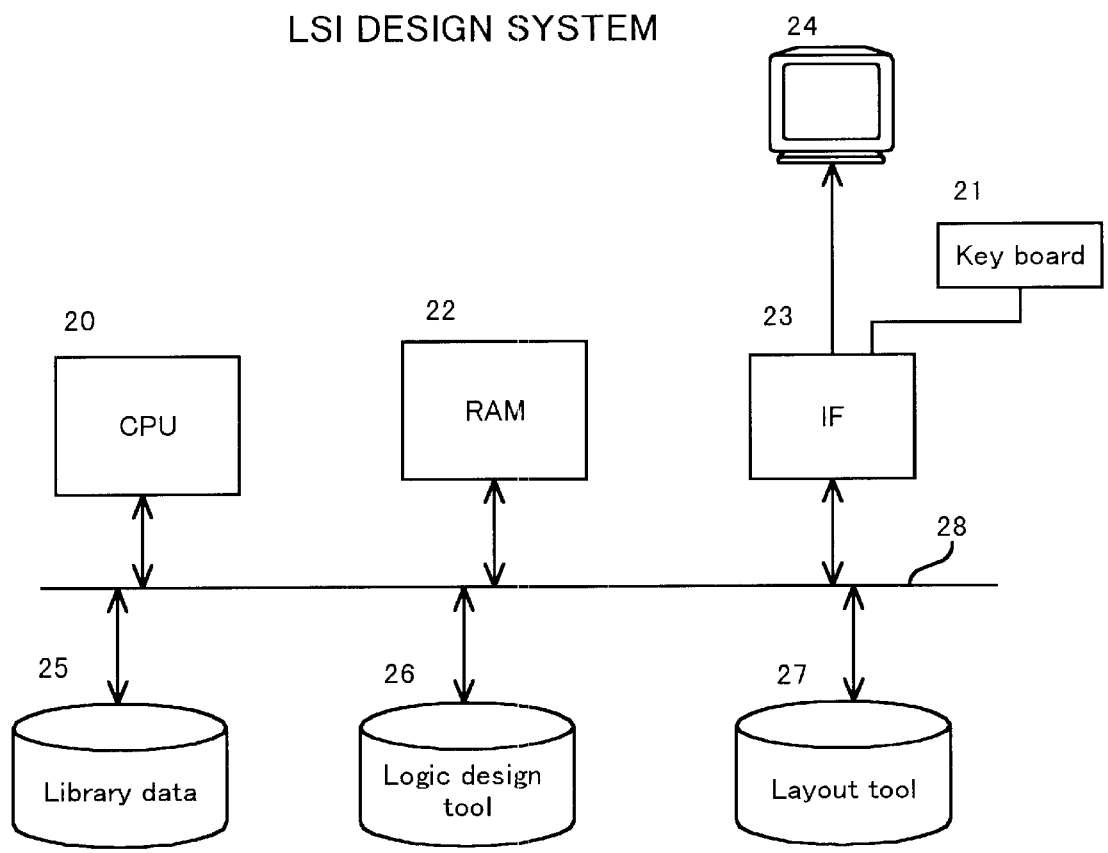
FIG. 6 shows the constitution of a LSI design system.

FIG. 6 shows the configuration of the LSI design system. Logic design S1, logic simulation S2, layout design S3, and simulation S4 in the flowchart in FIG. 5 are carried out with a LSI design system comprising a regular engineering workstation and design tool programs. Consequently, the LSI design system comprises CPU 20, RAM 22, and an interface 23 connected to input apparatus 21 such as a keyboard or mouse, and an external monitor apparatus 24, as shown in FIG. 6; these are connected with a bus 28. Library data 25, logic design tool 26, and layout tool 27 are stored within a recording medium such as a hard disk or magnetic tape. The layout tool 27, relating to the present embodiment, is a program comprising the functions explained below using flowcharts and design screens.

Figure 7:
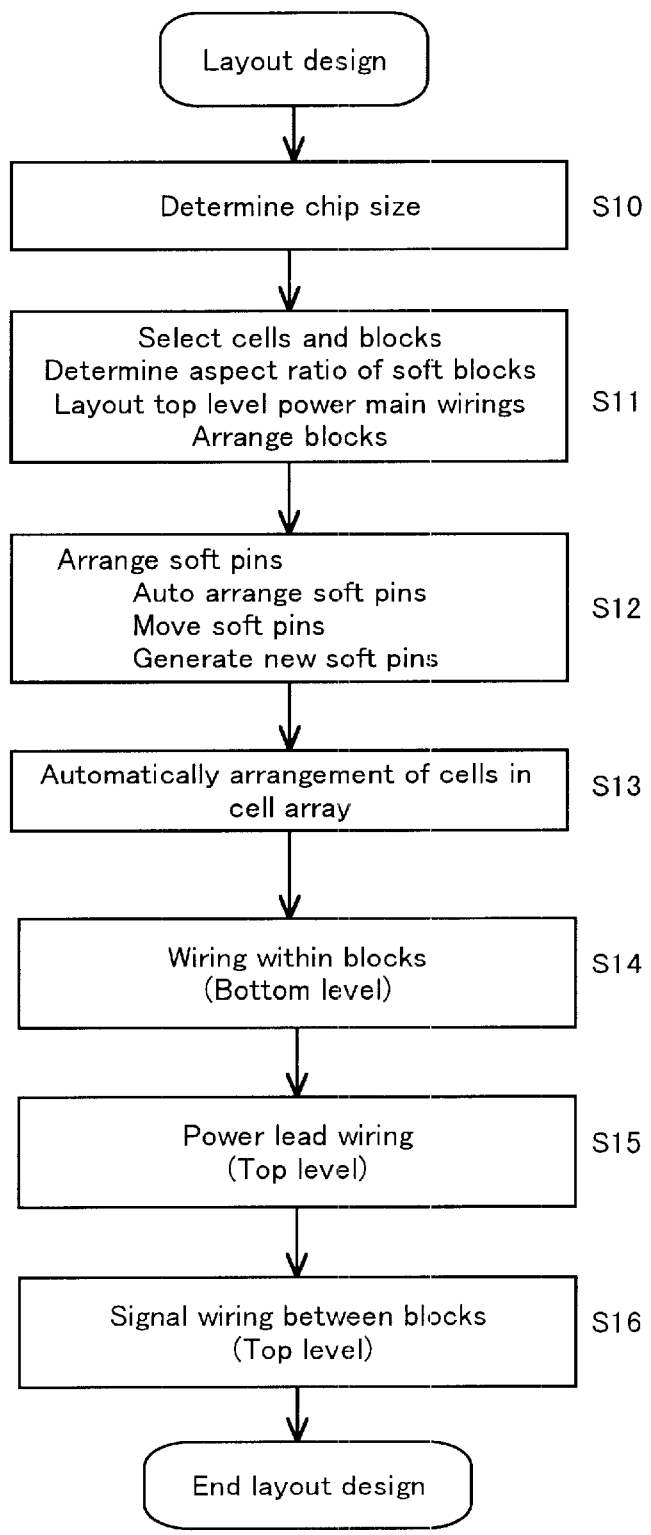
FIG. 7 is a flow chart of the layout design in the present embodiment.

FIG. 7 is a flow chart for layout design in the present embodiment. In the LSI design system shown in FIG. 6, the layout tool 27 is used for chip layout design. More specifically, the control screen, discussed below, and a design screen are provided with the monitor apparatus 24. The operator performs chip layout design by means of the GUI of these screens. In the following example, the explanation uses "Preview" (trade name), a layout tool from Cadence (Cadence Design Systems, Inc.).

FIGS. 8 through 15 show examples of the design screens corresponding to each process in FIG. 7. Each process in layout design, shown in the flow chart in FIG. 7, is explained with reference to these design screens.

Figure 8:
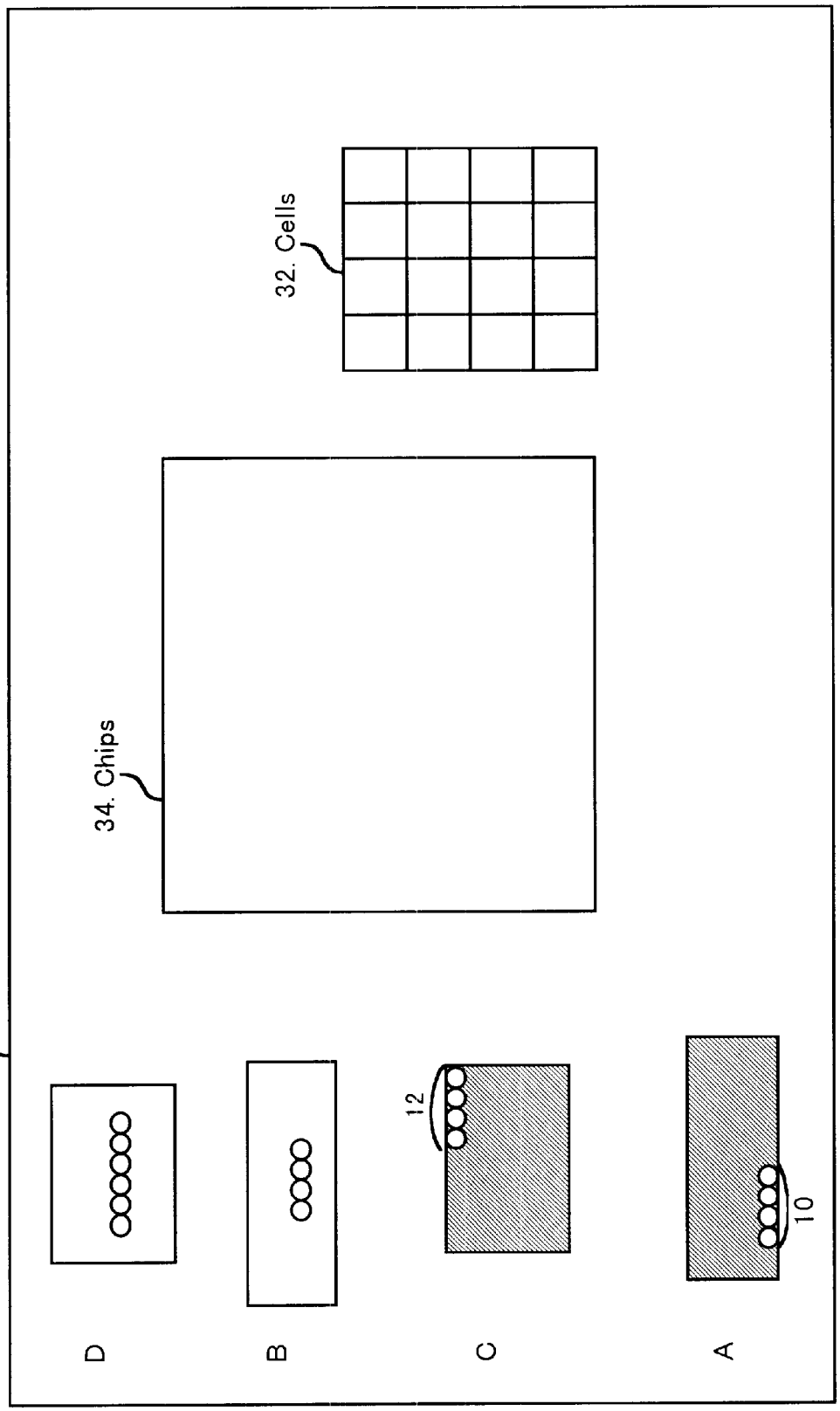
FIG. 8 shows a sample design screen corresponding to step S10 in FIG. 7.

FIG. 8 shows a sample design screen for step S10 for determining chip size. In FIG. 8, the design screen 30 displays usable blocks A, B, C, D on the left side and usable cells, in the form of a matrix, on the right side. A chip 34 is shown in the central portion therebetween. A control screen, not shown, shows tools with various functions necessary for layout design.

While referring to the design screen in FIG. 8, an operator first determines the size of the chip 34. The chip 34 can be set to an arbitrary size by dragging the frame of the chip 34 with the mouse. The minimum size, for including all blocks and cells in the net list already generated in the logic design process, is provided in advance. Naturally, it is not possible to set the chip to a smaller size than provided.

The plurality of blocks A–D and cells 32, shown on both sides of the screen, can be selected and laid out on the chip 34 by the operator dragging them onto the chip 34 with the mouse. The design screen shown in FIG. 8 shows hard blocks A, C and soft blocks B, D. The hard blocks A, C are shaded; the positions of the block pins 10, 12 thereof are fixed. The positions of the block pins of the soft blocks B, D are not determined and consequently, the block pins are temporarily located in the central portion of the blocks B, D, for example.

Figure 9:
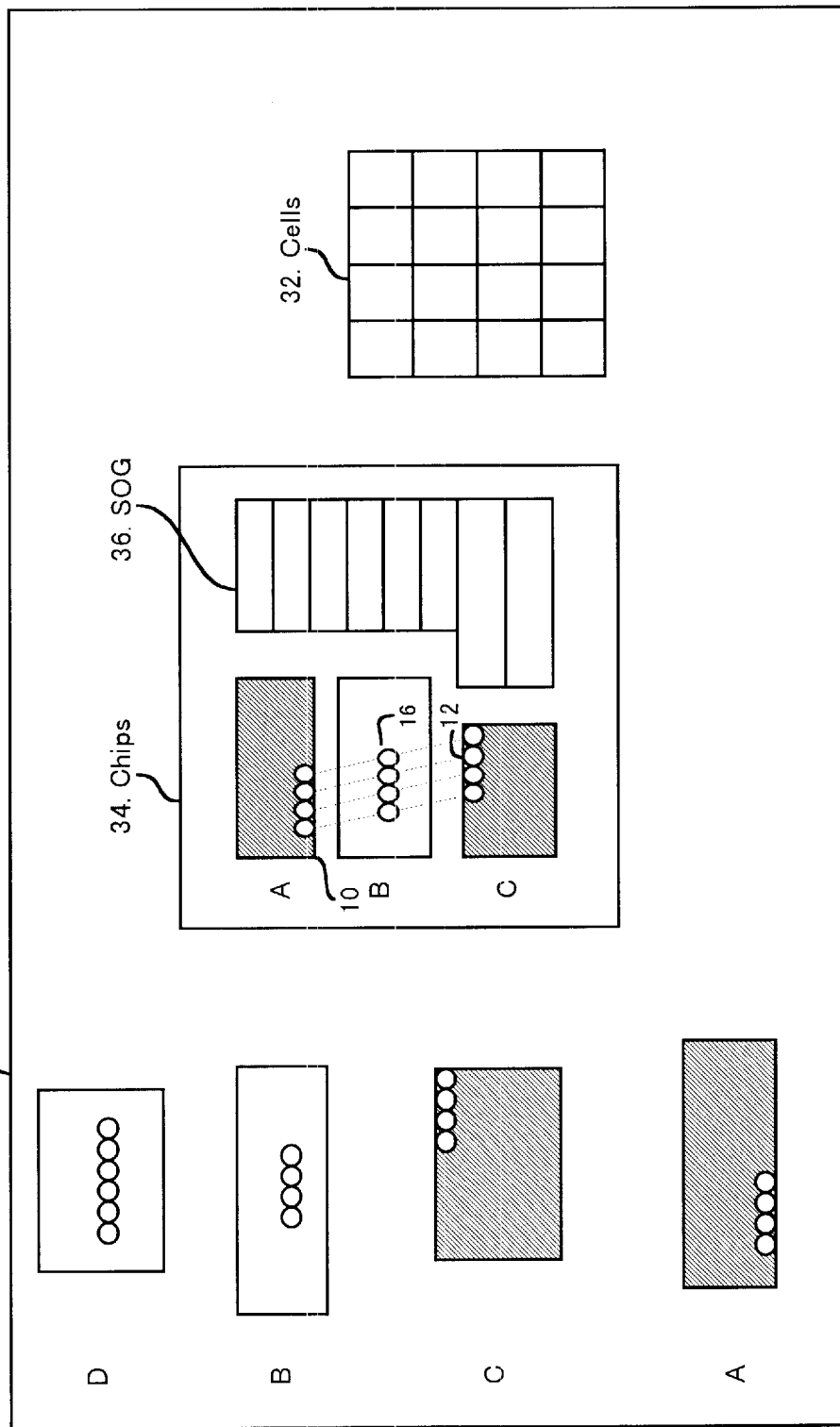
FIG. 9 shows a sample design screen corresponding to step S11 in FIG. 7.

FIG. 9 shows a sample design screen for step S11 for laying out blocks on the chip. In the example in FIG. 9, the selected hard blocks A, C and soft block B are dragged with the mouse and arranged on the chip 34; a gate region 36, wherein a plurality of cells are disposed, is further placed on the chip 34. After the size of the gate region 36 is selected, gate rows are formed as shown in this gate region 36 when "create row", a function of the layout tool, is executed. Master gate rows are disposed in these gate rows; and the selected cells are formed by using these master gate rows. This technique is the same as the method using a regular gate array.

In the situation shown in FIG. 9, blocks and cells are selected and the blocks and the gate region 36 where the cells are located are laid out. Also, the aspect ratio and size of the soft block B are established. Furthermore, top level power main wirings in the region between the blocks are also arranged, although these are not shown. The arrangement of top level power main wirings decides the extent of the wiring channels to be arranged in the region between the blocks. Block layout is determined according to that decision.

The net list is formed previously in the logic design process. The connective relationship among the block pins of the blocks A, B, C is determined already in the stage where the blocks A, B, C are arranged on the chip 34. Consequently, by designating a desired function from the control screen, not shown, the connective relationship thereof can be displayed on the design screen 30. In other words, the dotted line, between the block pins 16 of the soft block B and the block pins 10 of the hard block A, and the dotted line between the block pins 16 of the soft block B and the block pins 12 of the hard block C, show the connective relationship thereof in the FIG. 9.

Figure 10:
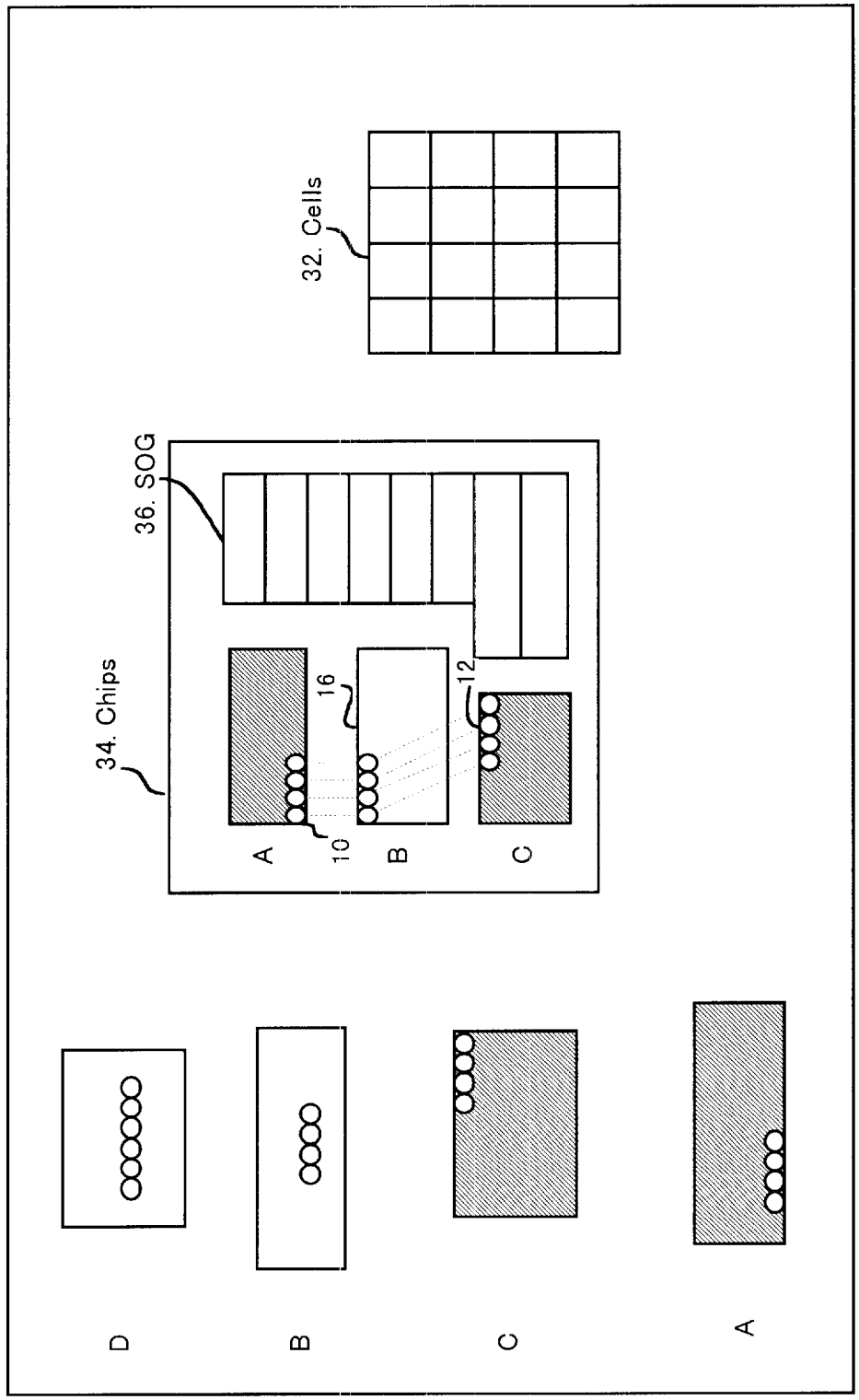
FIG. 10 shows a sample design screen corresponding to step S12 in FIG. 7.
Figure 11:
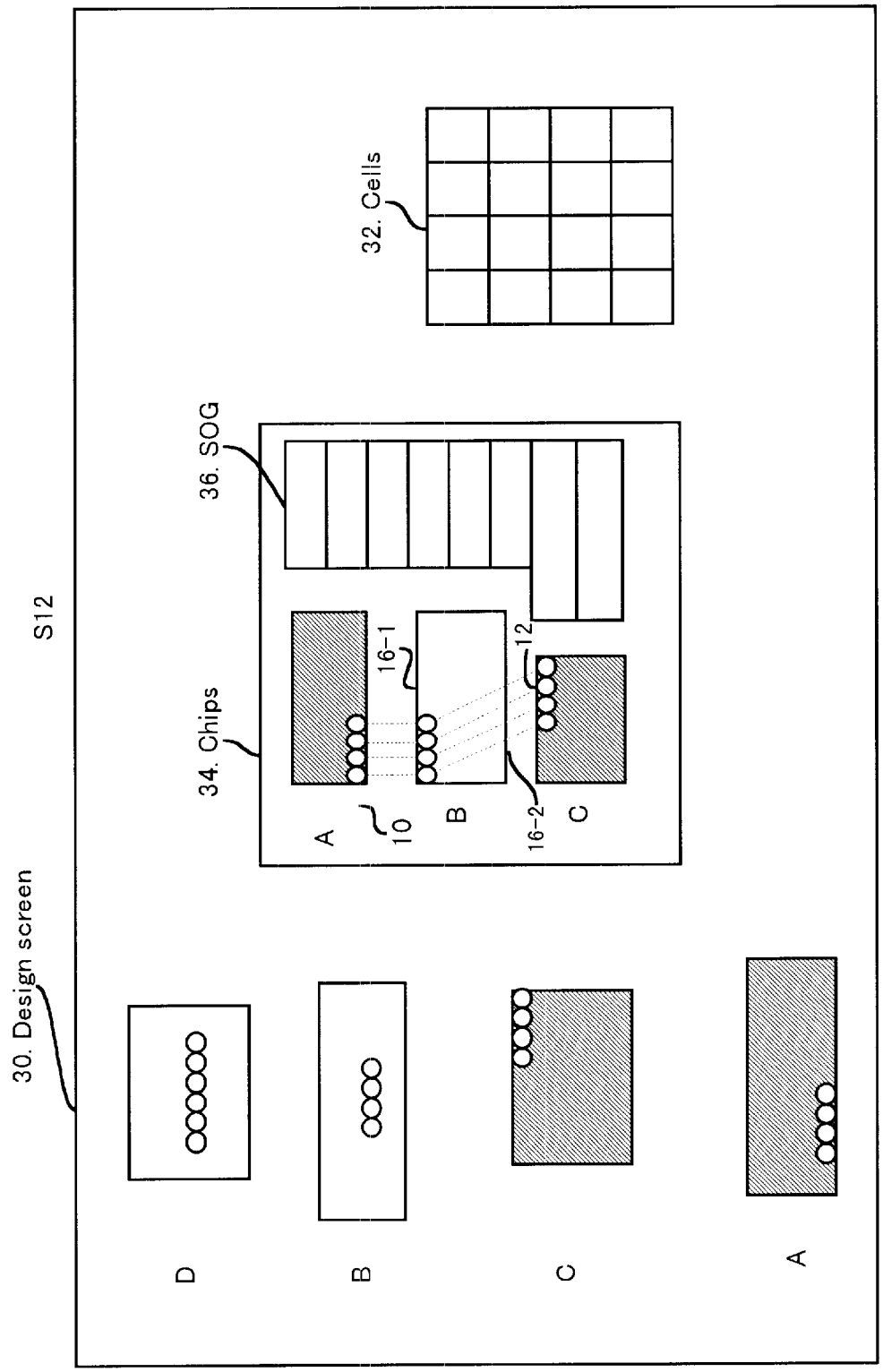
FIG. 11 shows a sample design screen corresponding to step S12 in FIG. 7.

FIGS. 10 and 11 show sample design screens for the process S12 of arranging soft pins, which are the block pins in the soft blocks. A conventional layout tool includes a function for automatically arranging soft pins in the optimum positions depending on the positions of other block pins connected thereto. The present embodiment includes a function for moving soft pin positions and a function for generating other soft pins with the same potential. Here, the optimal arrangement of block pins in the soft block B is made by moving and generating soft pins, which are novel functions of the present embodiment.

The soft pin moving function is used to move the soft pins 16 in the soft block B to the position 16-1 near the frame opposite to the block pins 10 of the hard block A, as shown in FIG. 10. As shown in FIG. 11, separate soft pins 16-2, with the same potential, are generated at a position opposite to the block pins 12 of the hard block C, in the vicinity of the frame (on or near the frame) of the soft block B. As a result, both soft pins 16-1, 16-2 are respectively placed at positions opposite to the block pins 10, 12 of the adjacent hard blocks A, B; these are positions on the upper edge and bottom edge of the soft block B. The length of the top level signal wirings, in the region between the blocks connecting these block pins, are minimized, as shown with the dotted lines. These functions of moving and generating soft pins are discussed in detail below.

Figure 12:
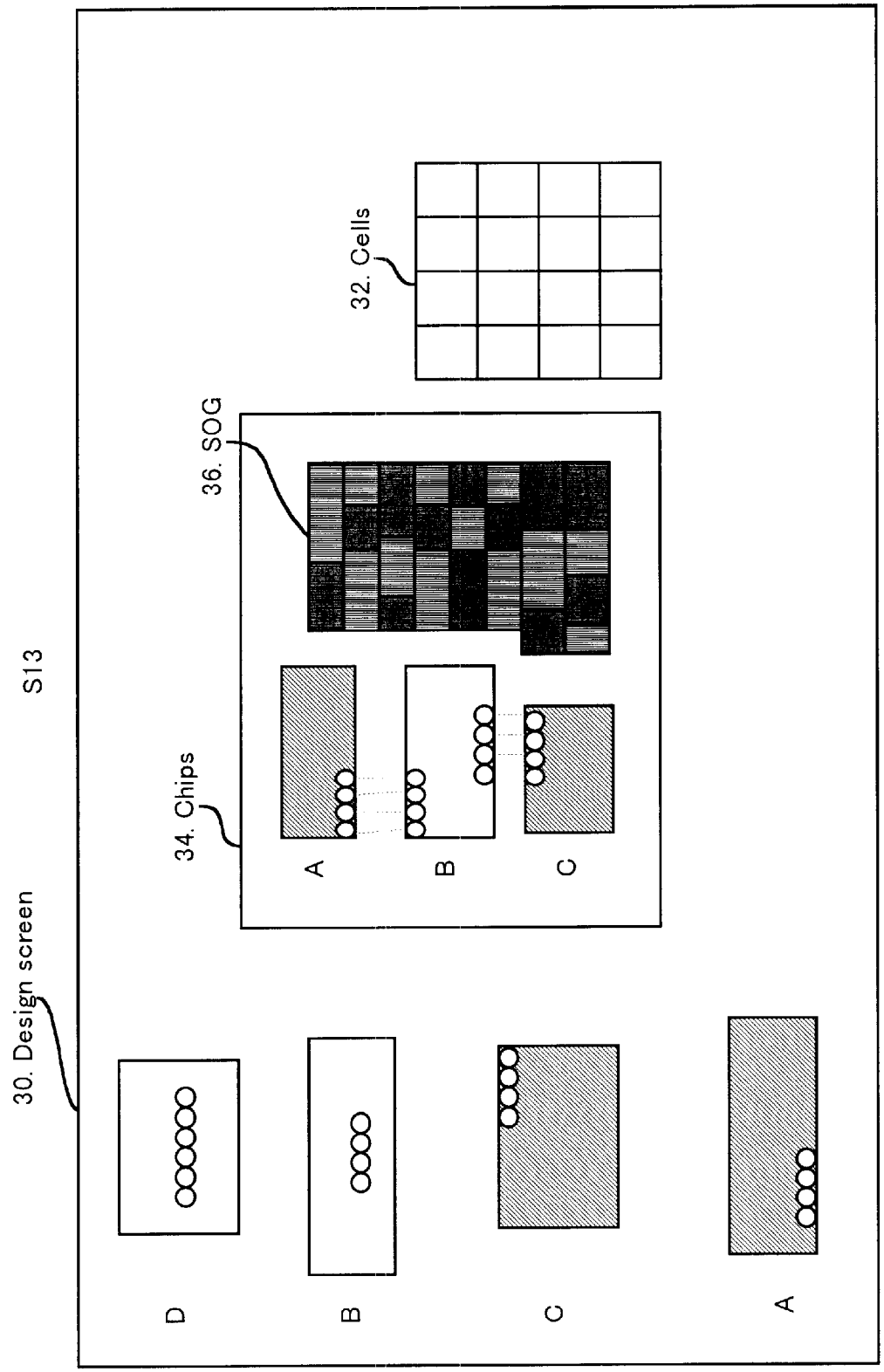
FIG. 12 shows a sample design screen corresponding to step S13 in FIG. 7.

FIG. 12 is a sample design screen for the step S13 for automatically arranging cells within the gate region 36, which becomes the cell array. The function of automatically arranging cells is a function called "cell auto-placer" in "Preview" which was discussed above. Once the cells used are selected, the optimum cell arrangement according to the net list is carried out, as shown by the shading (or slanted lines) in the figure, in the gate region 36. This type of function is a function for arranging cells in gate arrays. The cells placed in the arrays are connected together by signal wiring formed in the channel region between the gate arrays.

Figure 13:
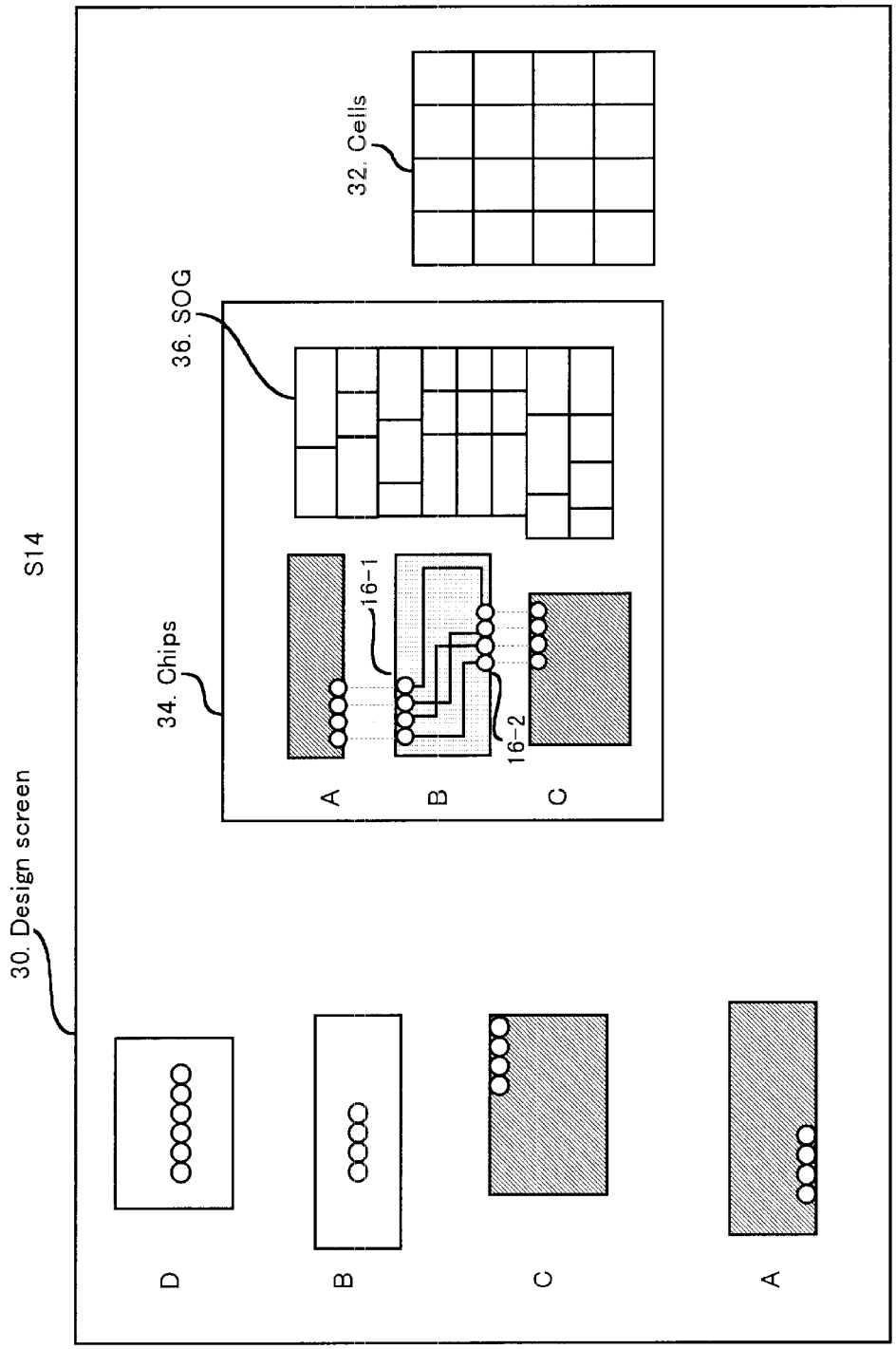
FIG. 13 shows a sample design screen corresponding to step S14 in FIG. 7.

FIG. 13 shows a sample screen for step S14 for establishing wiring within the blocks. Wiring within the blocks is bottom level wiring. Top level wiring is essentially determinable once the arrangement of blocks as well as the establishment of form and positions of the soft blocks are completed as shown in FIG. 12. Consequently, bottom level wiring can be established in the top down hierarchical layout design method relating to the present embodiment.

With a function called "auto place and route" in "Preview" as noted above, the placement of wiring within the soft block B is performed automatically according to the net list of that soft block. It should be noted that, when new soft pins are generated in step S12, a statement that the newly generated soft pins 16-2 should be connected to the existing soft pins 16-1 is added to the net list of the soft block B. With the addition of this statement, connective wiring is generated between circuit elements in the soft block B and among soft pins by "auto place and route". As a result, the soft block B becomes a hard block wherein the form, block pins, and internal wiring are fixed, as shown with the slanted lines in the FIG. 13.

Figure 14:
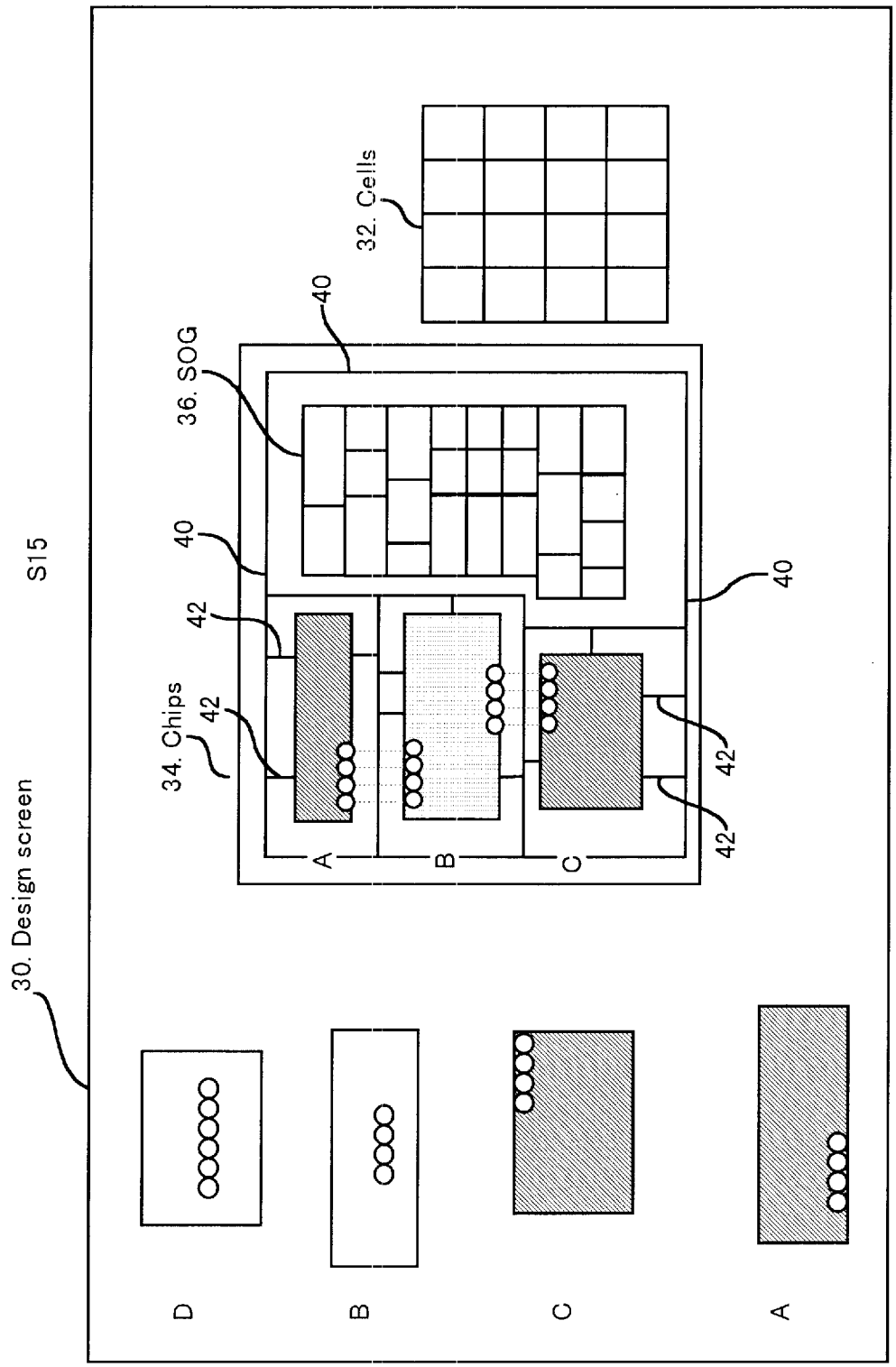
FIG. 14 shows a sample design screen corresponding to step S15 in FIG. 7.

FIG. 14 shows a sample design screen for step S15 for arranging power lead wiring. Power main wiring 40 is formed in the region between blocks (top level) in step S11. In step S15, then, the power lead wirings 42, between the power main wiring 40 and the power lead pins for blocks A, B, C, are generated. Power main wiring 40 is usually in the form of a mesh so as to surround blocks A, B, C. Consequently, the power main wiring 40 and power lead pins for the blocks are connected with the power lead wirings 42 of minimum length. For cells in the gate region 36, power is supplied to each gate constituting a cell by power wiring, not shown, which is disposed along the gate array, for example.

Figure 15:
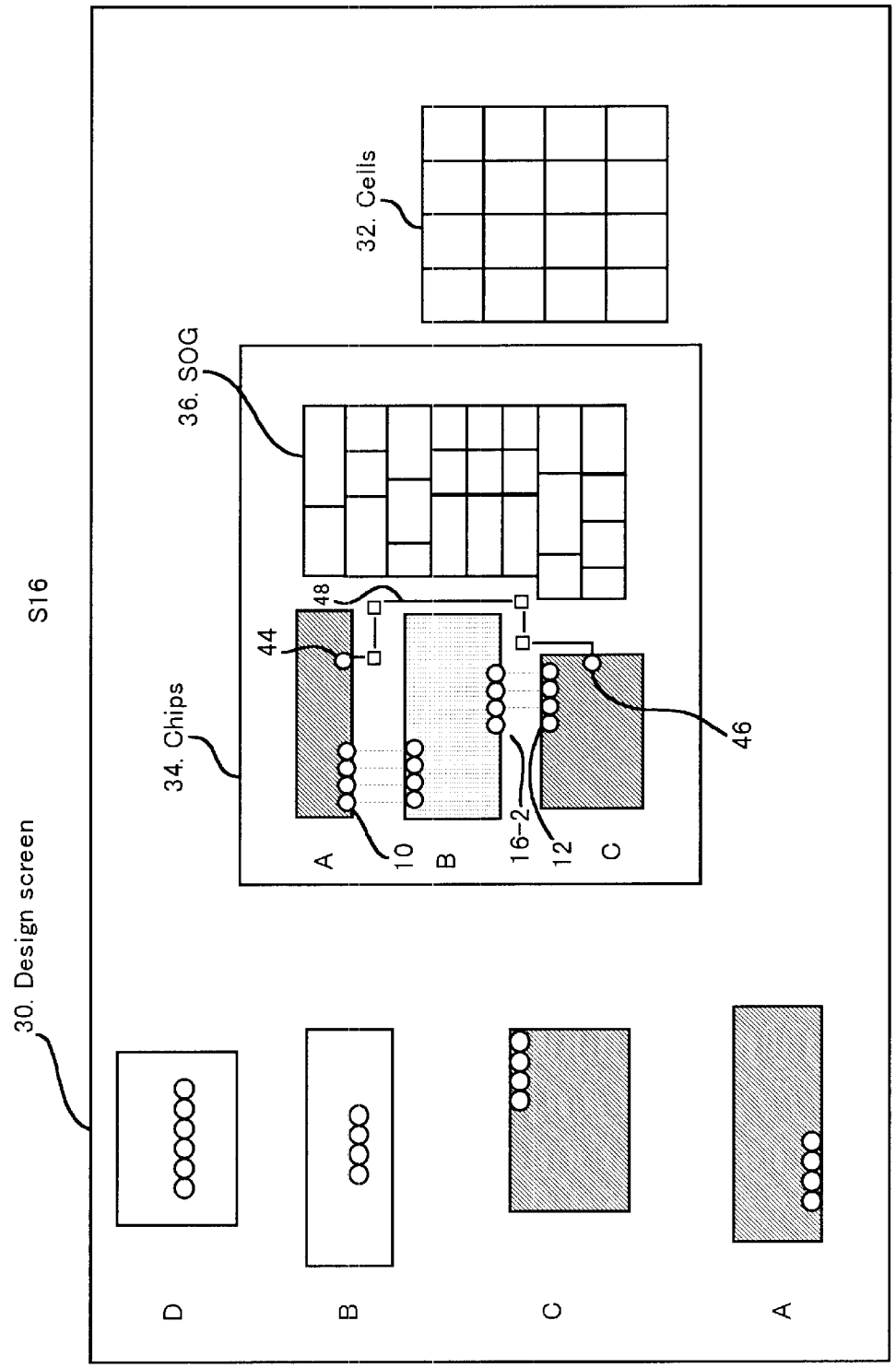
FIG. 15 shows a sample design screen corresponding to step S16 in FIG. 7.

FIG. 15 shows a sample design screen for step S16, for arranging signal wiring connecting the block pins in the region between the blocks (top level). In this step, the function of "Preview" called "auto route" is used to generate top level signal wiring for connecting the block pins in the region between the blocks according to the net list. As discussed above, the signal wiring between the block pins 10 of the aforementioned block A and the block pins 16-1 of the adjacent block B, and between the block pins 16-2 of block B and the block pins 12 of the adjacent block C, has the minimum length. As shown in the example display, the block pins 44 of the block A and the block pins 46 of the block C are connected by signal wiring 48 using the wiring channel region in the region between the blocks.

In the top down hierarchical layout design method relating to the present embodiment, the step S14 for generating bottom level wiring within the blocks, shown in FIG. 7, may also be performed after steps S15 and S16.

A plurality of blocks, plurality of cells, and top level signal wiring and power wiring connecting those are formed in the aforementioned layout process. According to the layout structure generated in this manner, simulation is performed again and it is checked whether the layout provides proper LSI function, as shown in the flow chart in FIG. 5.

Movement and Generation of Soft Pins

Figure 16:
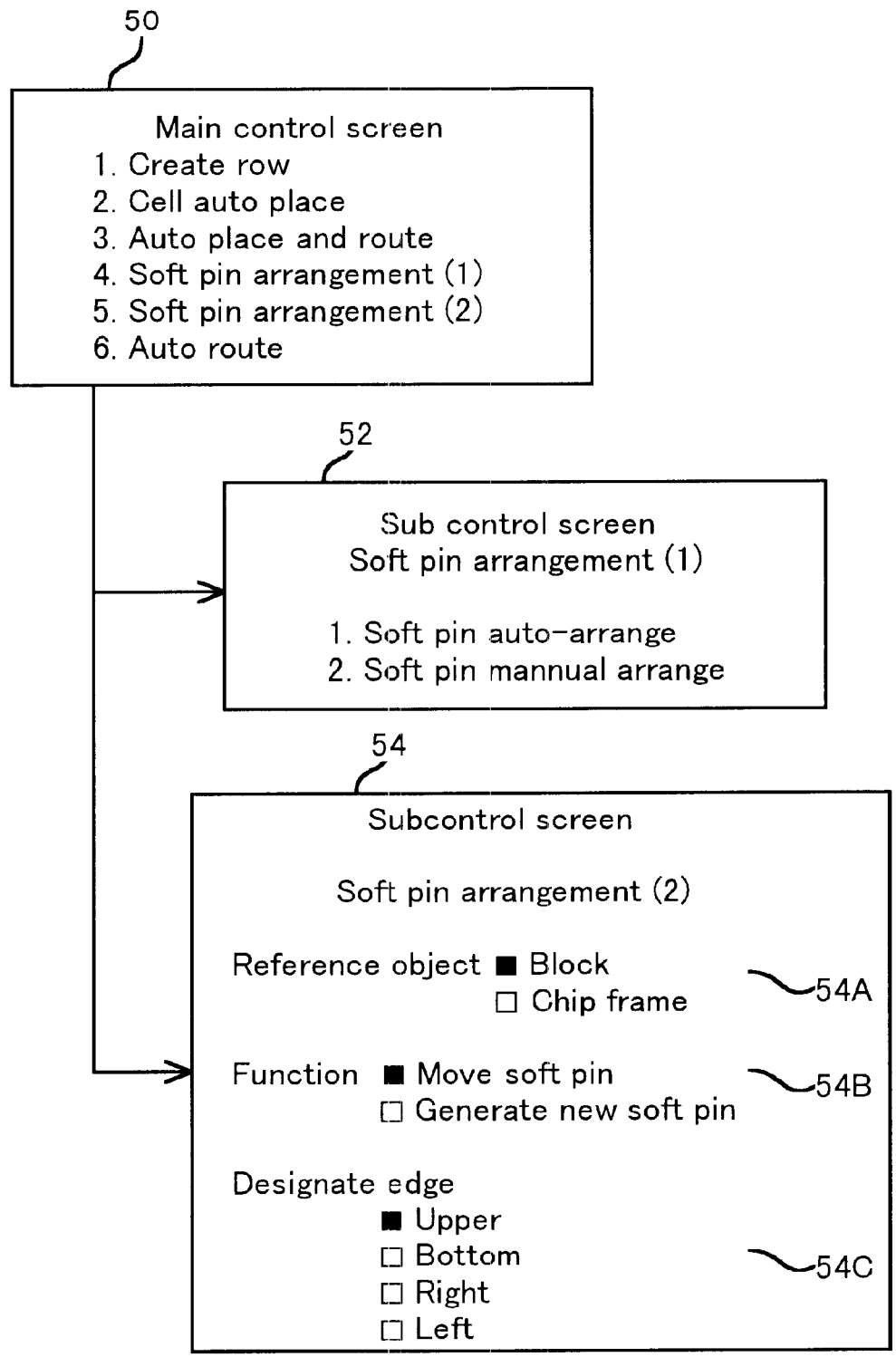
FIG. 16 shows a sample GUI control screen in the layout tool.

FIG. 16 shows a sample of the GUI control screen in the layout tool. A main control screen 50 and sub-control screens 52 and 54, which are parts thereof, are shown in FIG. 16. Create row, cell auto place, auto place and route, and auto route, which are the various functions of the layout tool discussed above, are listed in the main control screen 50. Furthermore, soft pin arrangements (1) and (2) are listed in the present embodiment. By clicking on the desired function in this main control screen 50, the operator doing the layout design can cause that function to be executed, or move to a sub-control screen corresponding to that function.

FIG. 16 shows the sub-control screen 52 corresponding to the soft pin arrangement (1) and the sub-control screen 54 corresponding to the soft pin arrangement (2). The functions of the soft pin arrangement (1) comprise a function for arranging soft pins of soft blocks in the optimal positions based on the relation to other connected block pins (soft pin auto-arrange function), and a function for manually arranging soft pins. A problem in conventional soft pin auto-arrange functions is that the arrangement becomes as shown in FIG. 3, wherein a wiring channel is wastefully used for the top level signal wiring 18, which becomes longer than necessary. The manual arrangement of soft pins requires a large amount of work because an operator must select and drag each soft pin into place with the mouse.

Meanwhile, the sub-control screen 54 corresponding to the soft pin arrangement (2), according to the present embodiment, includes the following: region 54A for designating the first reference object to which soft pins are connected; region 54B for designating whether to move or generate soft pins; and region 54C for designating an edge as the position where soft pins are generated or moved. An operator can make each designation by clicking on the respective buttons.

Figure 17:
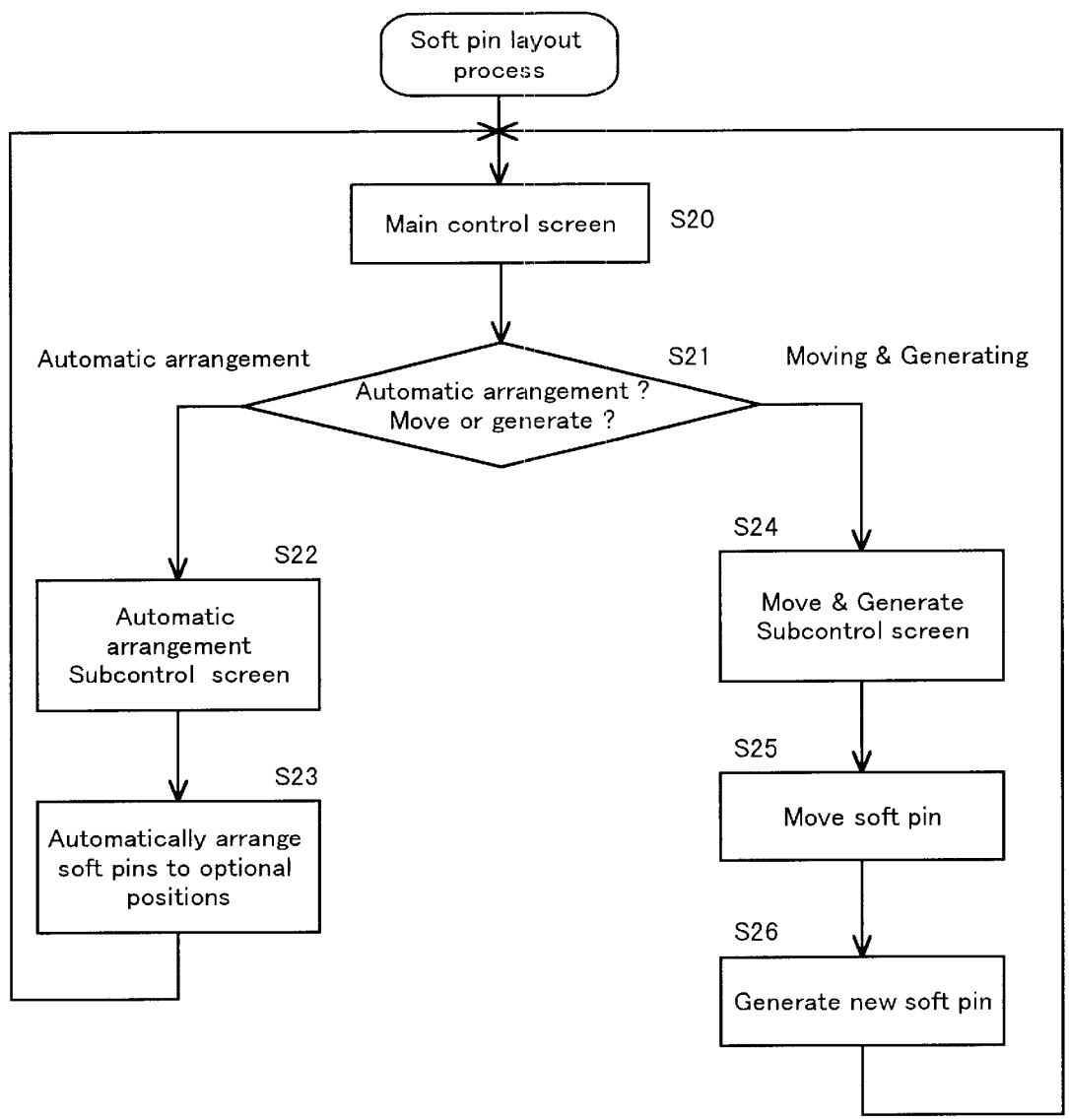
FIG. 17 is a flowchart showing the relationships of the control screens to the steps in step S12 for arranging the soft pins.

FIG. 17 is a flow chart showing the relationship of the control screens, in the soft pin arrangement step S12, to the respective processes. The only sub-control screens shown in FIG. 17 are the screens 52, 54 in FIG. 16. A flow chart for the sub-control screens for other functions in the main control screen 50 is not included.

Either soft pin arrangement (1) or (2) is selected in the main control screen 52 (S20, S21). The soft pin arrangement (1) is a function for automatically arranging soft pins as discussed above; the soft pin arrangement (2) is a function for moving or generating soft pins. When the soft pin arrangement (1) automatic arrangement function is selected, the screen switches to the sub-control screen 52 (S22). When the soft pin automatic arrangement function is selected in that screen, the soft pins are automatically placed in an optimal arrangement (S23). This automatic arrangement is carried out according to a prescribed algorithm based on the net list; therefore, the operator cannot arbitrarily decide to place soft pins in a particular region.

When the soft pin arrangement (2) for movement and generation of soft pins is selected in the main control screen 50, the screen switches to the sub-control screen 54 (S24). When the move soft pin function is selected in the sub-control screen 54 for moving and generating soft pins, the movement of the soft pins is carried out automatically by the layout tool according to an algorithm discussed below (S25). When the generate soft pins function is selected, new soft pins are generated automatically by the layout tool according to an algorithm discussed below (S26).

Figure 18:
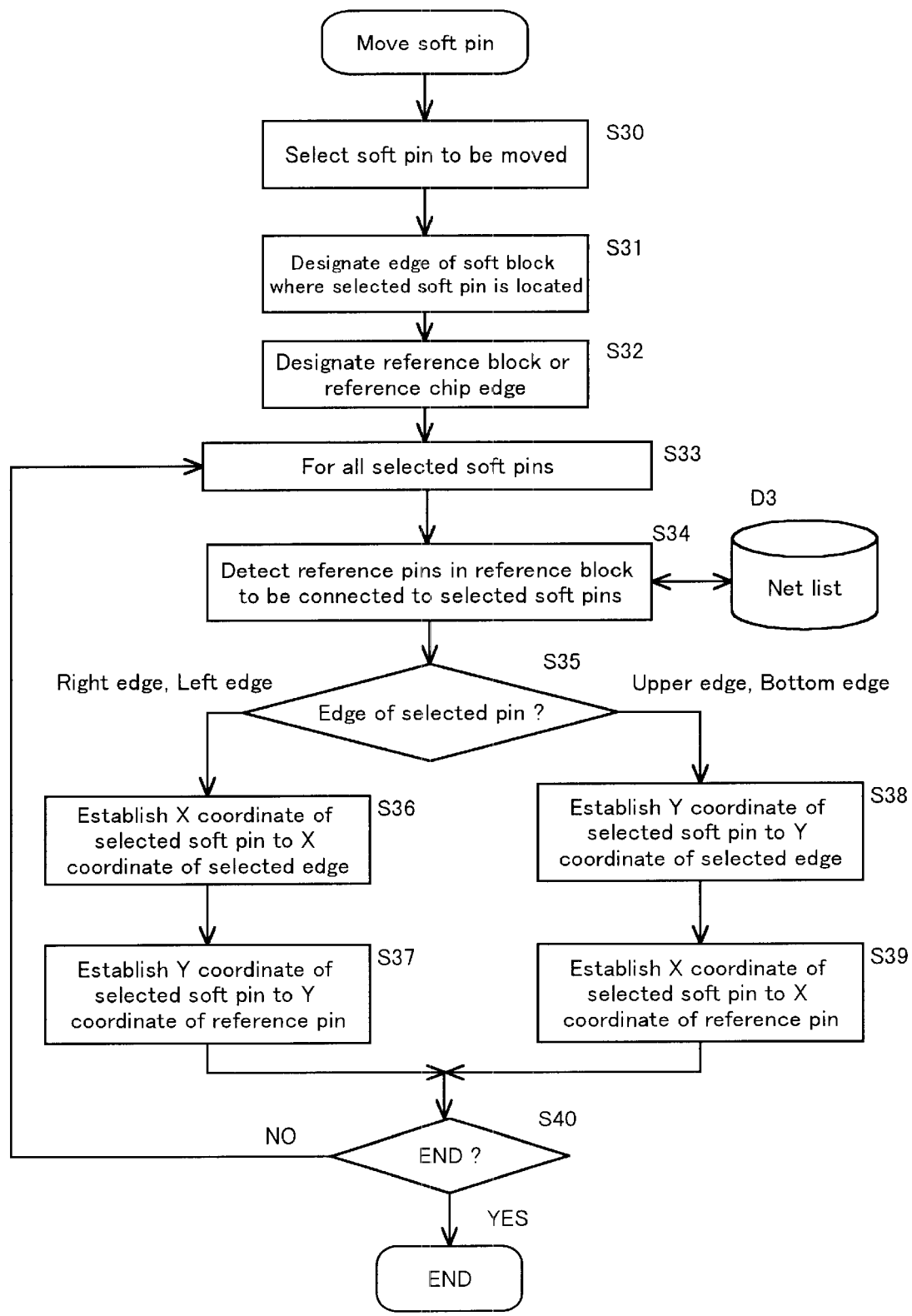
FIG. 18 is a flowchart of the function for moving soft pins, which are the block pins in the soft blocks.
Figure 19:
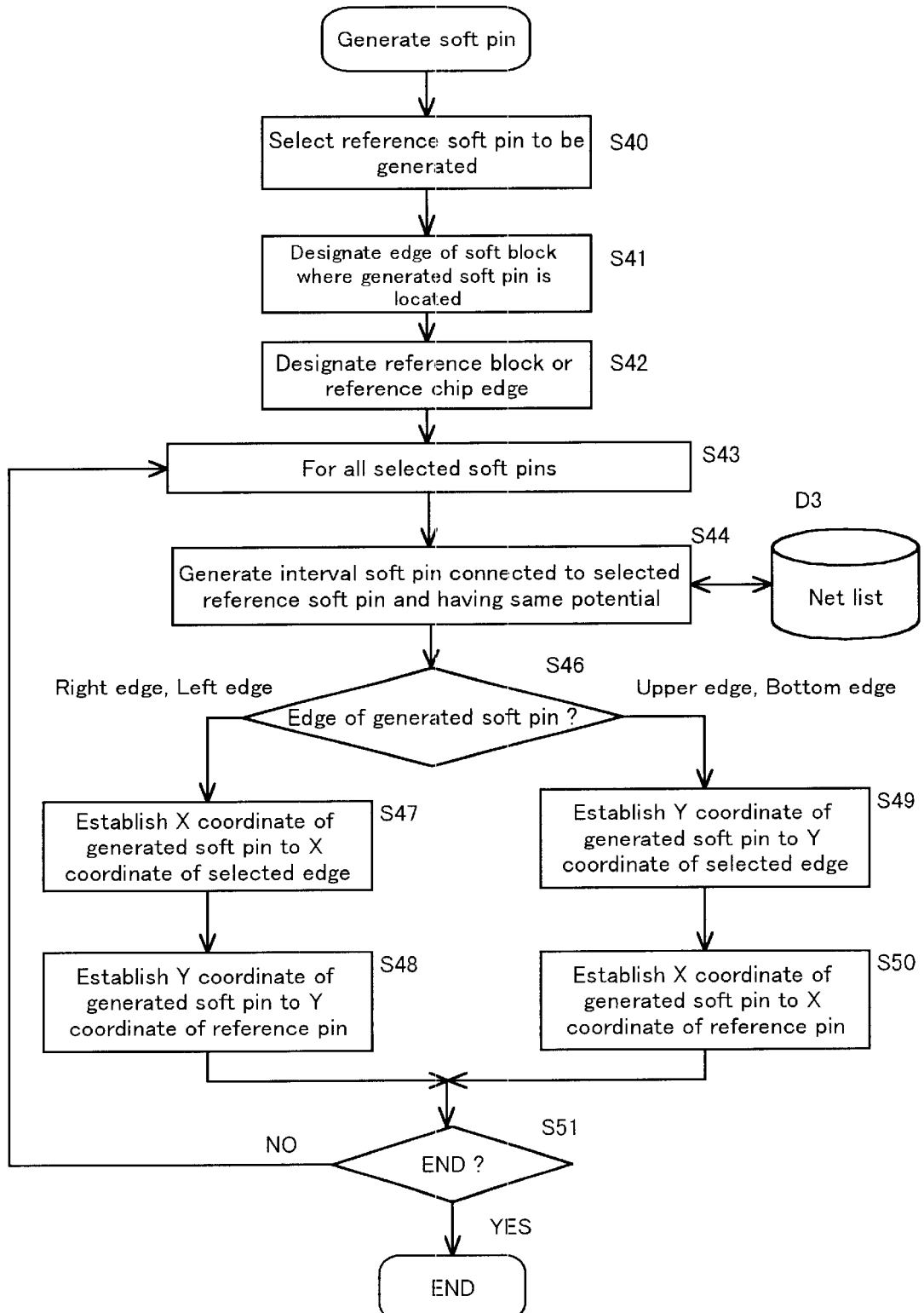
FIG. 19 is a flowchart of the function for generating soft pins, which are the block pins in the soft blocks.

FIG. 18 is a flow chart of the function for moving soft pins, which are the block pins in the soft blocks. FIG. 19 is a flow chart of the function for generating new soft pins in soft blocks. The layout tool in the present embodiment comprises functions of moving and generating soft pins in soft blocks according to the algorithms shown in the flow charts of FIGS. 18 and 19.

Figure 20:
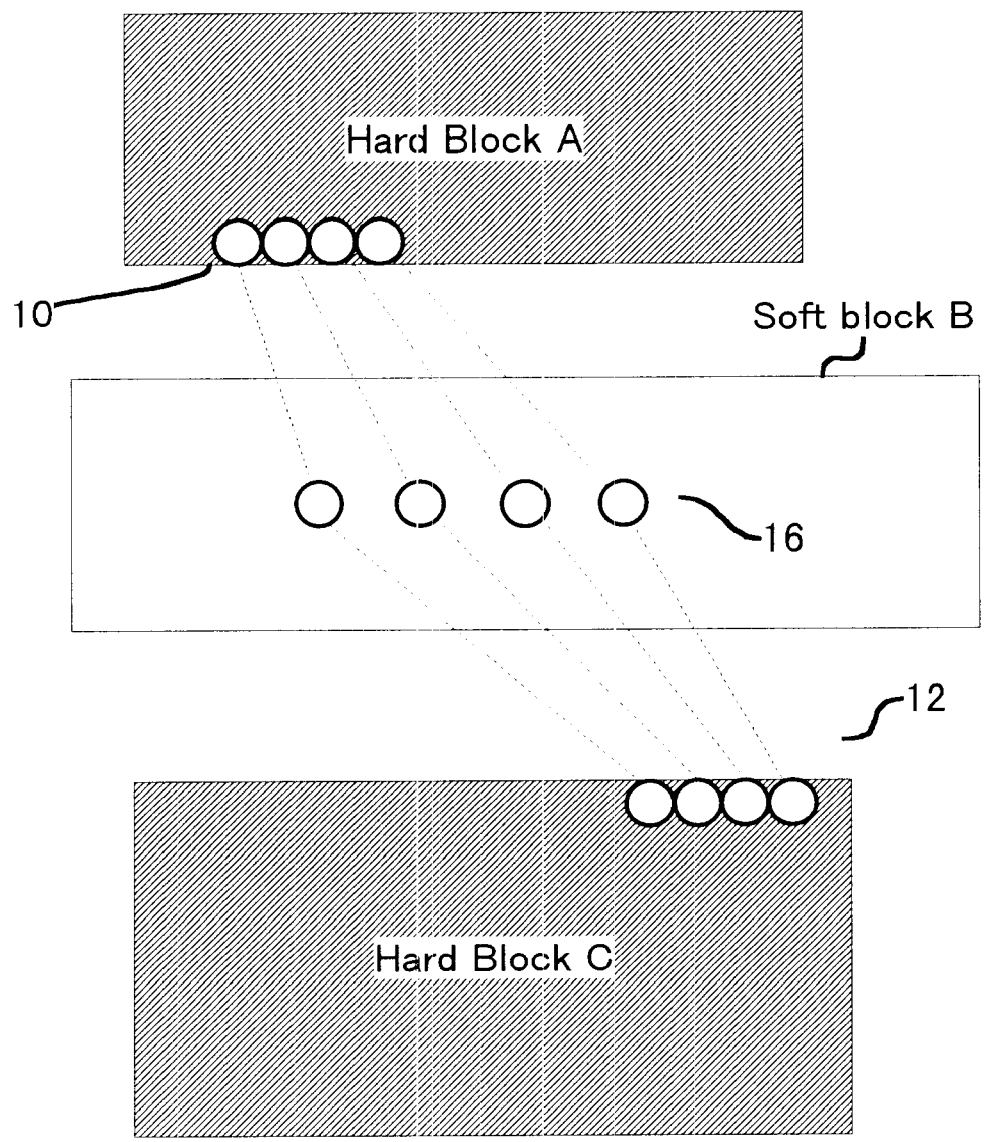
FIG. 20 is a drawing for explaining the movement and generation of the soft pins in the soft blocks.
Figure 21:
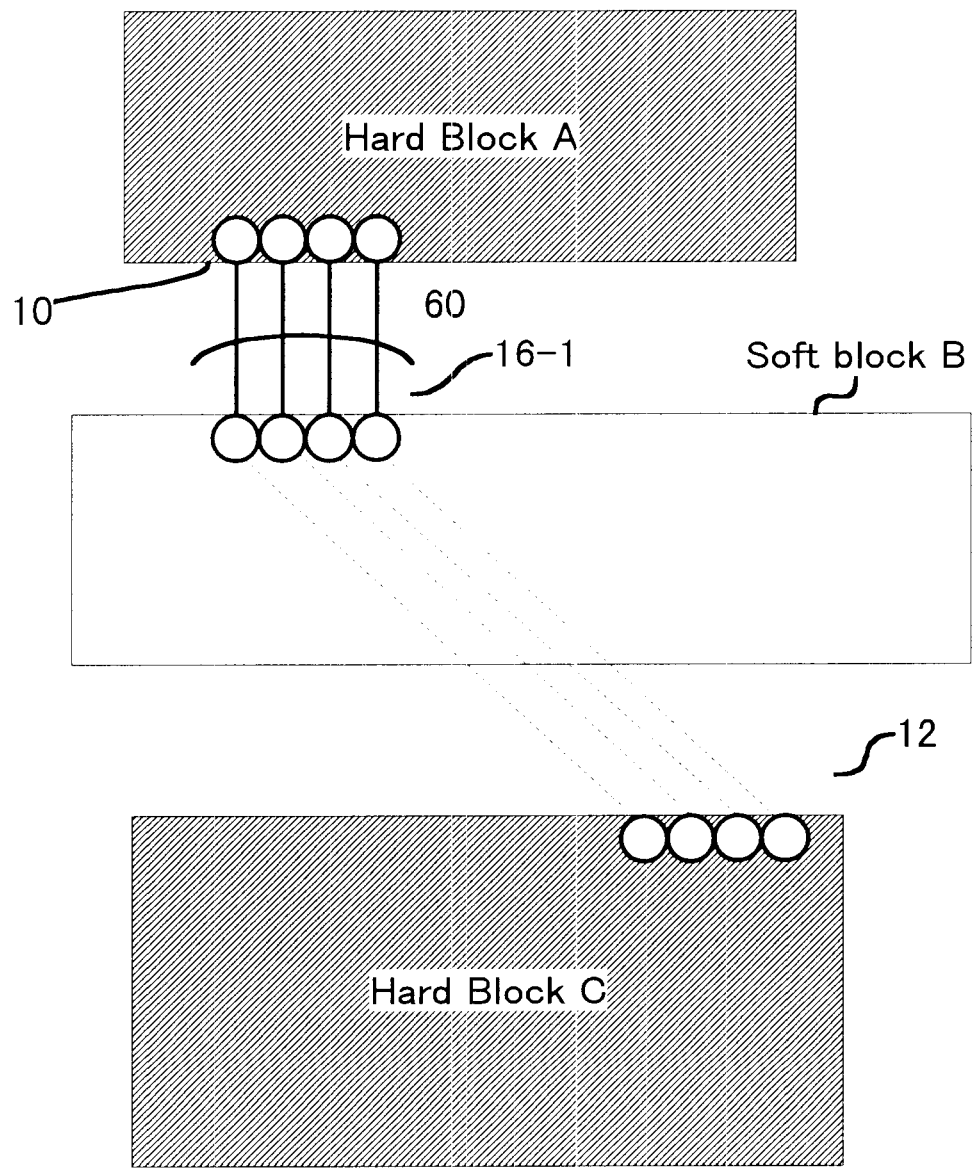
FIG. 21 is a drawing for explaining the movement and generation of the soft pins in the soft blocks.
Figure 22:
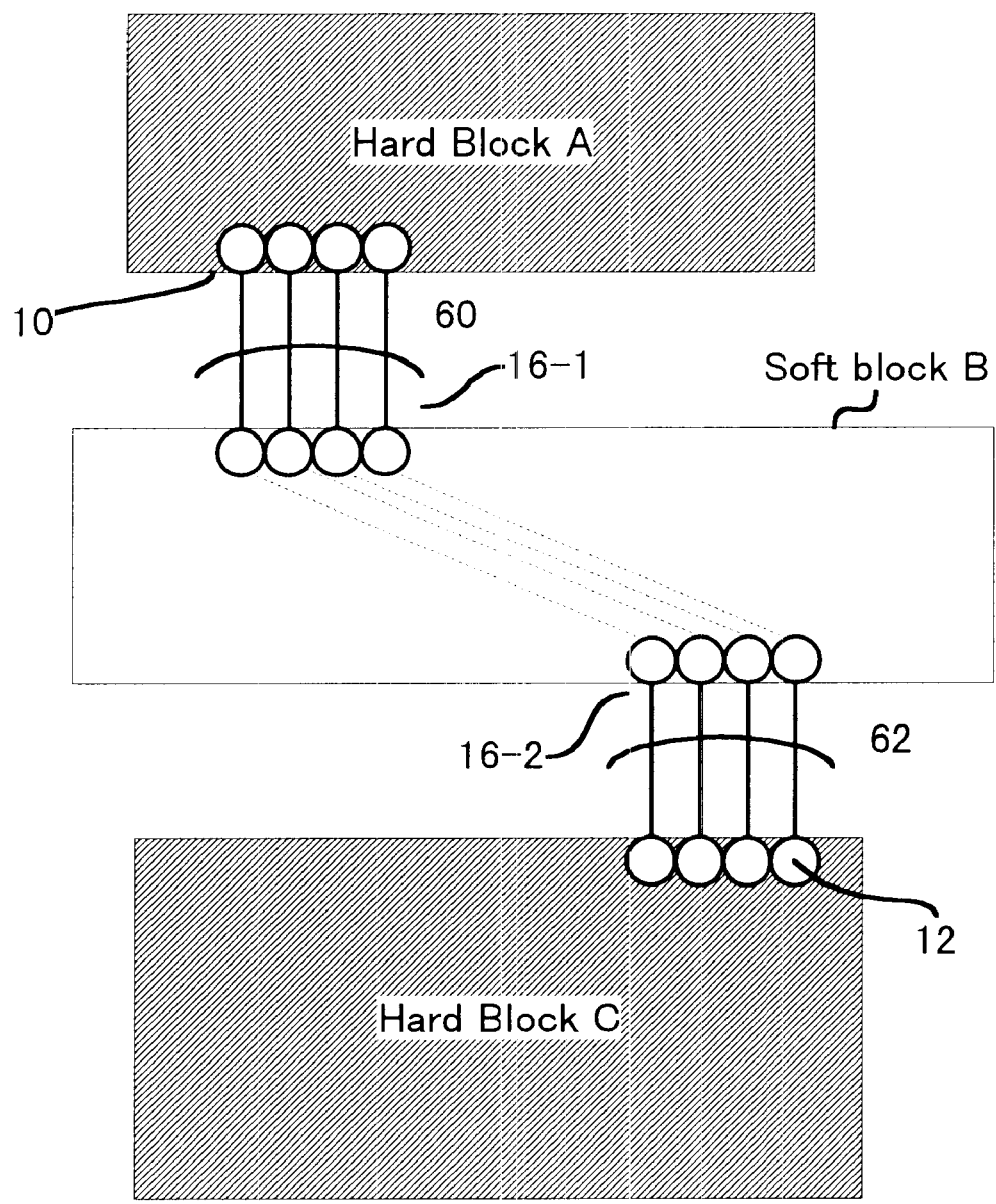
FIG. 22 is a drawing for explaining the movement and generation of the soft pins in the soft blocks.

FIGS. 20–22 are figures for explaining the movement and generation of the soft pins of the soft blocks. The movement and generation functions shown in FIGS. 18 and 19 are explained with reference to these figures.

The movement of soft pins of soft blocks is explained first. The control screen is in the state of the sub-control screen 54, and the design screen is in the state shown in FIG. 9 first. More specifically, hard blocks A, C are placed adjacent to and above and below the soft block B as shown in FIG. 20; according to the net list, the logical connection between the block pins of the hard blocks A, C and the soft pins 16 of the soft block B is shown with the dotted lines. According to the dotted lines showing this logical connection, the operator selects the position of the soft pins to be moved and the frame to be moved.

The operator selects movement of the soft pins in the sub-control screen 54. Then, in the design screen, the operator selects the soft pins to be moved which are in the soft block (S30). This can be accomplished by selecting the soft pins, which are subject to movement, with an input apparatus such as a mouse. Then, the position near the frame of the soft block, where the selected soft pins are located, is designated as shown in the sub-control screen 54 in FIG. 16 (S31). Specifically, the upper edge is designated in the example in FIG. 20. Then the designation of the reference block or reference chip edge which the soft pins are to be connected to is made in the sub-control screen 54 (S32). Specifically, it is established whether the soft pins 16 are to be connected to the block pins of the adjacent block or the contact pins on the adjacent edge of the chip. The automatic move function of the layout tool is carried out according to these settings.

In the flow chart in FIG. 18, steps S33 through S39 are repeated for all selected soft pins. With reference to the net list D3, the reference block pins, affiliated with the reference blocks connected with the selected soft pins, are detected (S34). The block pins 10 of the hard block A are detected in the example in FIG. 20. In this example, steps S38 and S39 are carried out because the selected soft pins are to be moved to the upper edge near the frame. Specifically, the layout tool establishes the Y coordinate of the selected soft pins 16 after movement as the Y coordinate of the upper edge of the designated soft block B (S38). Then the layout tool establishes the X coordinate of the selected soft pins 16 after movement as a value equal to the X coordinate of the reference block pins 10 (S39). When the soft pins are to be moved to the right edge or left edge near the frame, the X and Y coordinates after movement are established as shown in steps S36, 37.

Executing the aforementioned automatic movement function results in the position of the soft pins 16 after movement becoming position 16-1, opposite to the block pins 10 of the adjacent hard block A, as shown in FIG. 21. These pins 16-1 position have the same X coordinate as the block pins 10 of the hard block A. Consequently, in the subsequent top level signal wiring process, the block pins 10 and 16-1 are connected by the shortest wiring 60 as shown by the solid lines in FIG. 21.

In the situation in FIG. 21, the soft pins of the soft block B are located at a position matching to the block pins 10 of the adjacent hard block A and not matching to the block pins 12 of the other adjacent hard block C. Then, the new soft pin generating function is selected in the sub-control screen 54. The soft pin generating function is executed according to the flow chart in FIG. 19.

Reference soft pins, to have the same potential as the new soft pin to be generated, are selected in the design screen (S40). In this example, four soft pins 16-1 are selected. Then, the edge at which the newly generated soft pins, with the same potential as the selected reference soft pins 16-1, are arranged is designated in the sub-control screen 54 (S41). The bottom edge of the soft block B is selected here. Also, the sub-control screen 54 is used for the designation of the reference block or chip edge as the position to which the newly generated soft pins are to be connected (S42). The hard block C is selected here.

The layout tool carries out the automatic generation function, according to the algorithm in steps S43–S50 in FIG. 19, for all selected soft pins 16-1 and generates new soft pins 16-2 as shown in FIG. 22. These new soft pins 16-2 are located on the bottom edge of the soft block B and opposite to the block pins 12 of the adjacent hard block C. Internal soft pins, connected with the selected reference soft pins 16-1 and having the same potential thereof, are generated (S44) according to the automatic soft pin generating function shown in steps S43–S50. Next, the block pins 12, to which a connection will be made, are detected according to the net list D3 (S45); the block pins 12 are affiliated with the designated reference block C and are to be connected with the selected reference soft pins 16-1. When the position of the soft pins generated is the upper or lower edge, the position of the newly generated soft pins 16-2 is established by steps S49, S50. Because the lower edge is selected here, the Y coordinate of the generated soft pins 16-2 is set at the Y coordinate of the designated lower edge (S49). Then, the X coordinate of the generated soft pins 16-2 is set at the same value as the X coordinate of the block pins 12, the detected reference pins, of the hard block C (S50).

As a result, the soft pins 16-2, connected to the soft block 16-1 in the soft block B and having the same potential thereof, are newly generated at a position opposite to the block pins 12 of the adjacent hard block C as shown in FIG. 22. As a result, signal wiring 62, for connecting the pins 16-2 and 12 with the shortest length, is generated by the later process of arranging the top level signal wiring. When the designated edge is the right or left edge, the position of the newly generated soft pins is established as shown in steps S47, S48.

The soft pins 16-2, newly generated as discussed above, are added to the net list in the soft block B. Then, a statement or a description to the effect that these newly generated soft pins 16-2 are to be connected to the reference soft pins 16-1 is added to the net list. This statement corresponds to the dotted lines connecting soft pins 16-2 and 16-2 in FIG. 22.

Figure 23:
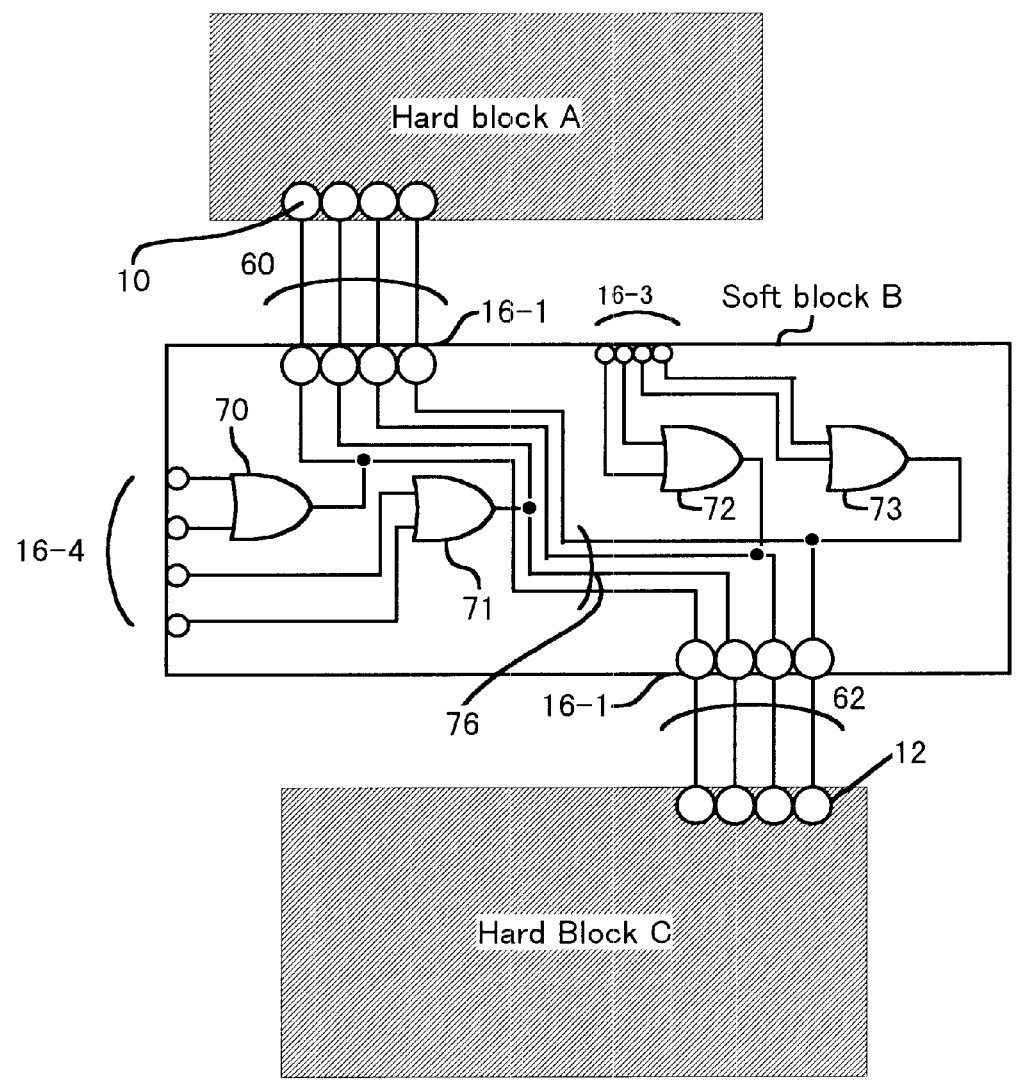
FIG. 23 is a drawing for explaining the steps for generating top level signal wiring and bottom level signal wiring.

FIG. 23 is a drawing for explaining the process of generating top level signal wiring and bottom level signal wiring. As already explained, the step S14 is for arranging the signal wiring in the soft block, which is the bottom level signal wiring in the flow chart in FIG. 7. In this step S14, the signal wiring 76 for connecting the soft pins 16-1 and 16-2 is arranged in the soft block B at the same time as the disposition of the signal wiring connecting the circuit elements 70–73 in the soft block B. In the step S16 for arranging the top level signal wiring in the region between the blocks, the connections between the block pins 10, 16-2 in blocks A, B, and between the block pins 12, 16-2 in blocks B, C are made by the signal wiring 60, 62, of minimum length. This signal wiring 60, 62 is short wiring extending in the Y direction; this wiring does not require a wasteful wiring channel and also minimizes signal propagation delay. The signal wiring 60, 62 extending in the Y direction is provided in a single signal wiring layer providing a Y-oriented wiring channel. This signal wiring 60, 62 does not require a separate channel for a signal wiring layer to provide an X-oriented wiring channel. Therefore, the signal wiring 60, 62 does not require a wasteful wiring channel and can reduce the size of the entire chip, thereby reducing signal propagation delay time among the blocks. In FIG. 23, input signals of the circuit elements 70–73 are supplied to the block pins 16-3, 16-4.

In the aforementioned embodiment, the generating function is executed after the function for moving soft pins, but the top level signal wiring can be optimized in the same manner even if the functions are executed in the opposite order, that is moving after generation.

Even if the entire design is executed using a bottom up system, sometimes the soft pins in the soft blocks are rearranged after block layout in a case where there are some soft blocks internally. The present invention can be applied to such steps. The aforementioned term "block" may also be called "macro" and "block pins" may also be called "macro terminals". However, a person skilled in the art will easily understand the use of those terms with those meanings in the present invention.

In the aforementioned embodiment, the example explained concerned a large scale chip including a plurality of blocks as well as a cell array region. However, the present invention can be applied in the case where the chip includes only a plurality of blocks and no cell array region. In the above embodiment, third and fourth soft pins can be generated at the peripheral area of the soft block if necessary as well as the second soft pin. The third and fourth soft pins are positioned opposite to block pins of adjacent blocks. Further, in the above embodiment, the signal line between the soft pins and the corresponding pins in the adjacent hard blocks are provided in a single layer. However, when the hard pins in the hard blocks are off grid, which defines a position of the signal line, the signal lines between the pins are comprised of two signal layer in directions of X and Y.

As explained above, the present invention provides a top down hierarchical layout design method, using soft blocks, comprising: a function for automatically moving block pins within soft blocks to positions opposite to block pins of adjacent blocks; and a function for generating new soft pins, connected to existing soft pins and having the same potential thereof, at positions opposite to the block pins of adjacent blocks. Consequently, the use of these functions makes it possible to generate top level signal wiring, for connecting block pins in the region between blocks, with the minimum length and without requiring a wasteful wiring channel.

What is claimed is:

1. An LSI manufacturing method for embedding in a chip a plurality of blocks having prescribed functions and comprising a plurality of circuit elements and a plurality of block pins connecting to the circuit elements and connecting externally, wherein said plurality of blocks comprises hard blocks, wherein the block pins in a vicinity of a frame comprise a fixed position at the layout design stage, and soft blocks, wherein the block pins in the vicinity of the frame comprise a variable position at the layout design stage, said manufacturing method comprising:

arranging said plurality of blocks on the chip;

moving a first block pin in said soft block to a position in the vicinity of the frame of said soft block and opposite to a first corresponding block pin in a first adjacent block;

generating a second block pin comprising a same potential as the first block pin in said soft block at a position in the vicinity of the frame of said soft block and opposite to a second corresponding block pin in a second adjacent block; and forming a first signal between the blocks for connecting said first block pin with said first corresponding block pin opposite thereto, and a second signal between the blocks for connecting said second block pin with said second corresponding block pin opposite thereto in a region between said plurality of blocks.

2. The LSI manufacturing method according to claim 1, further comprising a step of generating second block pin, having the same potential as first block pin in said soft block at a position in the vicinity of the frame of said soft block, and opposite to second corresponding block pin in a second adjacent block, wherein signal wiring between blocks, for connecting said second block pin with said second corresponding block pin opposite thereto, is formed in the step for forming said signal wiring between blocks.

3. The LSI manufacturing method according to claim 1, further comprising forming signal within blocks for connecting the circuit elements within said soft block to said plurality of block pins after the moving of said first block pin or generating of said second block pin within said soft block.

4. An LSI manufacturing method for embedding in a chip a plurality of blocks having prescribed functions and comprising a plurality of circuit elements and a plurality of block pins connecting to the circuit elements and connecting externally, wherein said plurality of blocks comprises hard blocks, wherein the block pins in a vicinity of a frame comprise a fixed position at the layout design stage, and soft blocks, wherein the block pins in the vicinity of the frame comprise a variable position at the layout design stage, said manufacturing method comprising:

arranging said plurality of blocks on the chip;

generating a second block pin comprising a same potential as a first block pin in said soft block at a position in the vicinity of the frame of said soft blocks and opposite to a second corresponding block pin in a second adjacent block;

moving the first block pin in said soft blocks to a position in the vicinity of the frame of said soft blocks and opposite to a first corresponding block pin in a first adjacent block; and forming a signal between the blocks for connecting said first block pin with said first corresponding block pin opposite thereto and for connecting said second block pin with said second corresponding block pin opposite thereto in a region between said plurality of blocks.

5. The LSI manufacturing method, according to claim 4, further comprising a step of:

moving the first block pin in said soft block, to a position in the vicinity of the frame of said soft block, and opposite to a first corresponding block pin in a first adjacent block; and wherein signal wiring between blocks, for connecting said first block pin with said first corresponding block pin opposite thereto, is formed in the step for forming said signal wiring between blocks.

6. The LSI manufacturing method, according to claim 4, further comprising forming signal within blocks for connecting the circuit elements within said soft block to said plurality of block pins after the moving of said first block pin or generating of said second block pin within said soft block.

7. A computer-readable recording medium for storing a layout program for embedding in a chip a plurality of blocks having prescribed functions and comprising a plurality of circuit elements and a plurality of block pins connecting to the circuit elements and connecting externally and arranging said plurality of blocks on the chip, wherein said plurality of blocks comprises hard blocks, wherein the block pins in a vicinity of a frame comprise a fixed position at the layout design stage, and soft blocks, wherein the block pins in the vicinity of the frame comprise a variable position at the layout design stage, and after arranging said plurality of blocks on the chip, said layout program causes said computer to execute:

moving a first block pin in said soft block to a position in the vicinity of the frame of said soft block and opposite to a first corresponding block pin in a first adjacent block;

generating a second block pin comprising a same potential as the first block pin in said soft block at a position in the vicinity of the frame of said soft block and opposite to a second corresponding block pin in a second adjacent block; and forming a first signal between the blocks for connecting said first block pin with said first corresponding block pin opposite thereto, and a second signal between the blocks for connecting said second block pin with said second corresponding block pin opposite thereto in a region between said plurality of blocks.

8. The recording medium for storing the layout program according to claim 7, wherein said layout program further causes said computer to execute a procedure of:

generating second block pin, having the same potential as first block pin in said soft block at a position in the vicinity of the frame of said soft block, and opposite to second corresponding block pin in a second adjacent block;

wherein signal wiring between blocks, for connecting said second block pin with said second corresponding block pin opposite thereto, is formed in a procedure for forming said signal wiring between blocks.

9. The recording medium for storing the layout program according to claim 7, wherein said layout program causes said computer to execute forming signal within blocks for connecting the circuit elements within said soft block to said plurality of block pins after moving of said first block pin or generating of said second block pin within said soft block.

10. A computer readable recording medium for storing a layout program for embedding in a chip a plurality of blocks having prescribed functions and comprising a plurality of circuit elements and a plurality of block pins connecting to the circuit elements and connecting externally and arranging said plurality of blocks on the chip, wherein said plurality of blocks comprises hard blocks, wherein the block pins in a vicinity of a frame comprise a fixed position at the layout design stage, and soft blocks, wherein the block pins in the vicinity of the frame comprise a variable position at the layout design stage; and after arranging said plurality of blocks on the chip, said layout program causes said computer to execute:

generating a second block pin comprising a same potential as a first block pin in said soft block at a position in the vicinity of the frame of said soft block and opposite to a second corresponding block pin in a second adjacent block;

moving the first block pin in said soft block to a position in the vicinity of the frame of said soft block and opposite to a first corresponding block pin in a first adjacent block; and forming a signal between the blocks for connecting said first block pin with said first corresponding block pin opposite thereto and for connecting said second block pin with said second corresponding block pin opposite thereto in a region between said plurality of blocks.

11. The recording medium for storing the layout program according to claim 10, wherein said layout program further causes said computer to execute a procedure of:

moving first block pin in said soft block, to a position in the vicinity of the frame of said soft block, and opposite to a first corresponding block pin in a first adjacent block;

wherein signal wiring between blocks, for connecting said first block pin with said first corresponding block pin opposite thereto, is formed in a procedure for forming said signal wiring between blocks.

12. The recording medium for storing the layout program according to claim 10, wherein said layout program causes said computer to execute forming signal within blocks for connecting the circuit elements within said soft block to said plurality of block pins after moving of said first block pin or generating of said second block pin within said soft block.

13. An integrated circuit, wherein a plurality of blocks comprising prescribed functions, a plurality of circuit elements, and a plurality of block pins connecting externally, are embedded in a chip, wherein said plurality of blocks comprise:

first and second block pins comprising the same potential and arranged in the vicinity of a frame of the plurality of blocks, and in positions opposite to first and second corresponding block pins, respectively, in first and second adjacent blocks, wherein a signal wiring between said first block pin and said first corresponding block pin and a signal wiring between said second block pin and said second corresponding block pin are formed in the region between said plurality of blocks.

* * * * *

UNITED STATES PATENT AND TRADEMARK OFFICE
CERTIFICATE OF CORRECTION

PATENT NO. : 6,378,115 B1  Page 1 of 1
DATED : April 23, 2002
INVENTOR(S) : Atsushi Sakurai It is certified that error appears in the above-identified patent and that said Letters Patent is hereby corrected as shown below:

Column 12,
Lines 40-50, delete claim 2.

Column 13,
Lines 13-22, delete claim 5.
Lines 56-67, delete claim 8.

Column 14,
Lines 34-44, delete claim 11.

Signed and Sealed this

Nineteenth Day of November, 2002

Attest:

Attesting Officer

JAMES E. ROGAN
*Director of the United States Patent and Trademark Office*